(12) United States Patent
Chung et al.

(10) Patent No.: US 10,756,134 B2
(45) Date of Patent: Aug. 25, 2020

(54) LIGHT-EMITTING DEVICE

(71) Applicant: EPISTAR CORPORATION, Hsinchu (TW)

(72) Inventors: Hsin-Chan Chung, Hsinchu (TW); Wen-Luh Liao, Hsinchu (TW); Shih-Chang Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/926,708

(22) Filed: Mar. 20, 2018

(65) Prior Publication Data

US 2018/0277590 A1   Sep. 27, 2018

(30) Foreign Application Priority Data

Mar. 21, 2017  (TW) .............................. 106109284 A

(51) Int. Cl.
| | |
|---|---|
| *H01L 33/08* | (2010.01) |
| *H01L 27/15* | (2006.01) |
| *H01L 33/06* | (2010.01) |
| *H01L 33/30* | (2010.01) |
| *H01L 33/60* | (2010.01) |
| *H01L 33/62* | (2010.01) |
| *H01L 33/00* | (2010.01) |
| *H01L 33/44* | (2010.01) |
| *H01L 33/38* | (2010.01) |
| *H01L 33/22* | (2010.01) |
| *H01L 33/46* | (2010.01) |
| *H01L 33/42* | (2010.01) |

(52) U.S. Cl.
CPC ............ *H01L 27/15* (2013.01); *H01L 27/153* (2013.01); *H01L 33/0062* (2013.01); *H01L 33/06* (2013.01); *H01L 33/30* (2013.01); *H01L 33/38* (2013.01); *H01L 33/44* (2013.01); *H01L 33/60* (2013.01); *H01L 33/62* (2013.01); *H01L 33/0093* (2020.05); *H01L 33/22* (2013.01); *H01L 33/42* (2013.01); *H01L 33/46* (2013.01); *H01L 2933/0058* (2013.01); *H01L 2933/0066* (2013.01)

(58) Field of Classification Search
CPC .............................. H01L 27/156; H01L 33/08
See application file for complete search history.

(56) References Cited

U.S. PATENT DOCUMENTS

| | | | |
|---|---|---|---|
| 9,196,806 B2 | 11/2015 | Lin et al. | |
| 2007/0222370 A1* | 9/2007 | Zhu ..................... | H01L 51/0097 313/504 |
| 2012/0205685 A1* | 8/2012 | Seo ..................... | H01L 51/5044 257/89 |

(Continued)

*Primary Examiner* — George R Fourson, III
(74) *Attorney, Agent, or Firm* — Patterson + Sheridan, LLP

(57) ABSTRACT

A light-emitting device includes: a substrate comprising a first side; multiple semiconductor stacks on the first side and separated from each other, wherein each of the multiple semiconductor stacks comprises a light extraction area; multiple electrode pads on the multiple semiconductor stacks; and a blocking layer between one of the semiconductor stacks and the substrate. The multiple semiconductor stacks comprises a first semiconductor stack and a second semiconductor stack, and the first semiconductor stack and the second semiconductor stack are independently controlled to emit light.

20 Claims, 20 Drawing Sheets

(56) References Cited

U.S. PATENT DOCUMENTS

| | | | |
|---|---|---|---|
| 2012/0205686 A1* | 8/2012 | Seo | H01L 27/3209 257/89 |
| 2012/0315714 A1* | 12/2012 | Shanks | C09K 19/2028 438/29 |
| 2013/0335155 A1 | 12/2013 | Sato | |
| 2014/0131729 A1* | 5/2014 | Heo | H01L 33/62 257/76 |
| 2014/0179029 A1* | 6/2014 | Bhat | H01L 33/0079 438/7 |
| 2015/0279822 A1* | 10/2015 | Hsu | H01L 25/0753 257/89 |
| 2015/0295154 A1 | 10/2015 | Tu et al. | |
| 2017/0025484 A1* | 1/2017 | Forrest | H01L 51/56 |
| 2017/0256748 A1* | 9/2017 | Koike | H01L 51/5036 |
| 2018/0323396 A1* | 11/2018 | Tsukamoto | H01L 51/50 |

* cited by examiner

LIGHT-EMITTING DEVICE

CROSS REFERENCE TO RELATED APPLICATIONS

This application claims the benefit of TW Application Serial No. 106109284, filed on Mar. 21, 2017, and the entire content of which is hereby incorporated by reference.

TECHNICAL FIELD

The disclosure relates to a light-emitting device, and particularly to a light-emitting device comprising a blocking layer.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical devices.

SUMMARY OF THE DISCLOSURE

The present disclosure provides a light-emitting device. The light-emitting device comprises a light-emitting device comprises: a substrate comprising a first side; multiple semiconductor stacks on the first side and separated from each other, wherein each of the multiple semiconductor stacks comprises a light extraction area; multiple electrode pads on the multiple semiconductor stacks; and a blocking layer between one of the semiconductor stacks and the substrate; wherein the multiple semiconductor stacks comprises a first semiconductor stack and a second semiconductor stack, and the first semiconductor stack and the second semiconductor stack are independently controlled to emit light.

The present disclosure provides a light-emitting device. The light-emitting device comprises a substrate comprising a first side; a first semiconductor stack on the first side of the substrate and a second semiconductor stack on the first side of the substrate and separated from the first semiconductor stack; when the first semiconductor stack emits a first light and the second semiconductor stack does not emit a light, a ratio of the intensity of the first light emitted from the second semiconductor stack to the intensity of the first light emitted from the first semiconductor stack is less than 0.1 from a near field image of the light-emitting device.

The light-emitting device comprises a distance between the first semiconductor stack and the second semiconductor stack, and the distance is not greater than 20 μm.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein:

FIG. 1 is a cross-sectional diagram showing a light-emitting device according to a first embodiment of the present disclosure;

DETAILED DESCRIPTION OF PREFERRED EMBODIMENTS

Figure 1A:
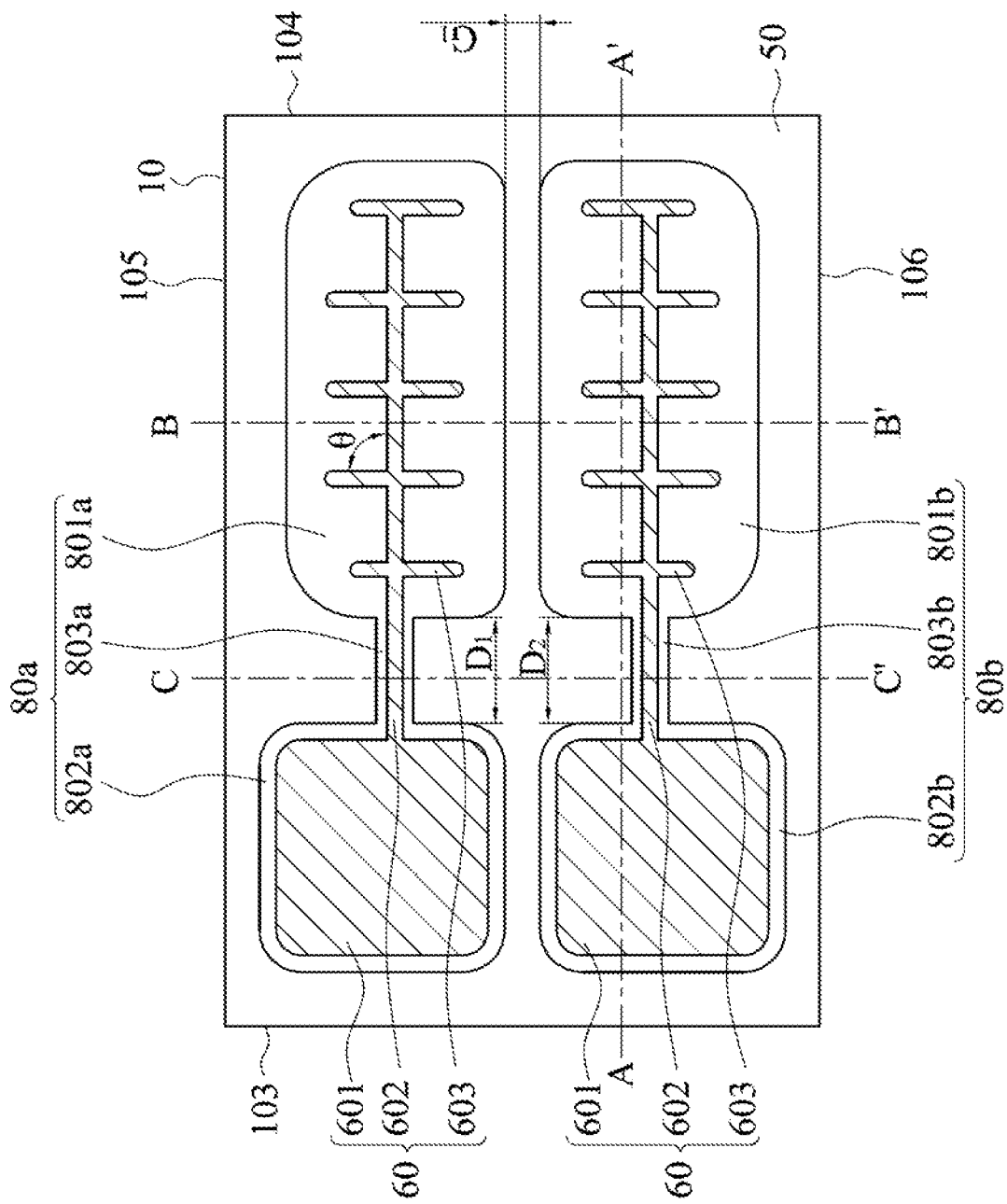
FIG. 1A is a top view of a light-emitting device according to a first embodiment of the present disclosure.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present disclosure, if not specifically mention, the general expression of AlGaAs means $Al_xGa_{(1-x)}As$, wherein $0≤x≤1$; AlInP means $Al_xIn_{(1-x)})P$, wherein $0≤x≤1$; the general expression of AlGaInP means $(Al_yGa_{(1-y)})_{1-x}In_xP$, wherein $0≤x≤1$, $0≤y≤1$; the general expression of AlGaN means $Al_xGa_{(1-x)}N$, wherein $0≤x≤1$; the general expression of AlAsSb means $AlAs_{(1-x)}Sb_x$ wherein $0≤x≤1$ and the general expression of InGaP means $In_xGa_{1-x}P$, wherein $0≤x≤1$; the general expression of InGaAsP means $In_xGa_{1-x}As_{1-y}P_y$, wherein $0≤x≤1$, $0≤y≤1$; the general expression of InGaAsN means $In_xGa_{1-x}As_{1-y}N_y$, wherein $0≤x≤1$, $0≤y≤1$; the general expression of AlGaAsP means $Al_xGa_{1-x}As_{1-y}P_y$, wherein $0≤x≤1$, $0≤y≤1$; the general expression of InGaAs means $In_xGa_{1-x}As$, wherein $0≤x≤1$; the general expression of AlGaN means $Al_xGa_{1-x}N$, wherein $0≤x≤1$; the general expression of InGaN means $In_xGa_{1-x}N$, wherein $0≤x≤1$; the general expression of InAlGaN means $In_xAl_yGa_{1-x-y}N$, wherein $0≤x≤1$, $0≤y≤1$. The content of the element can be adjusted for different purposes, such as, but not limited to matching the lattice constant of the growth substrate or adjusting the peak wavelength or the dominant wavelength emitted from the light-emitting device of the present disclosure.

Figure 1B:
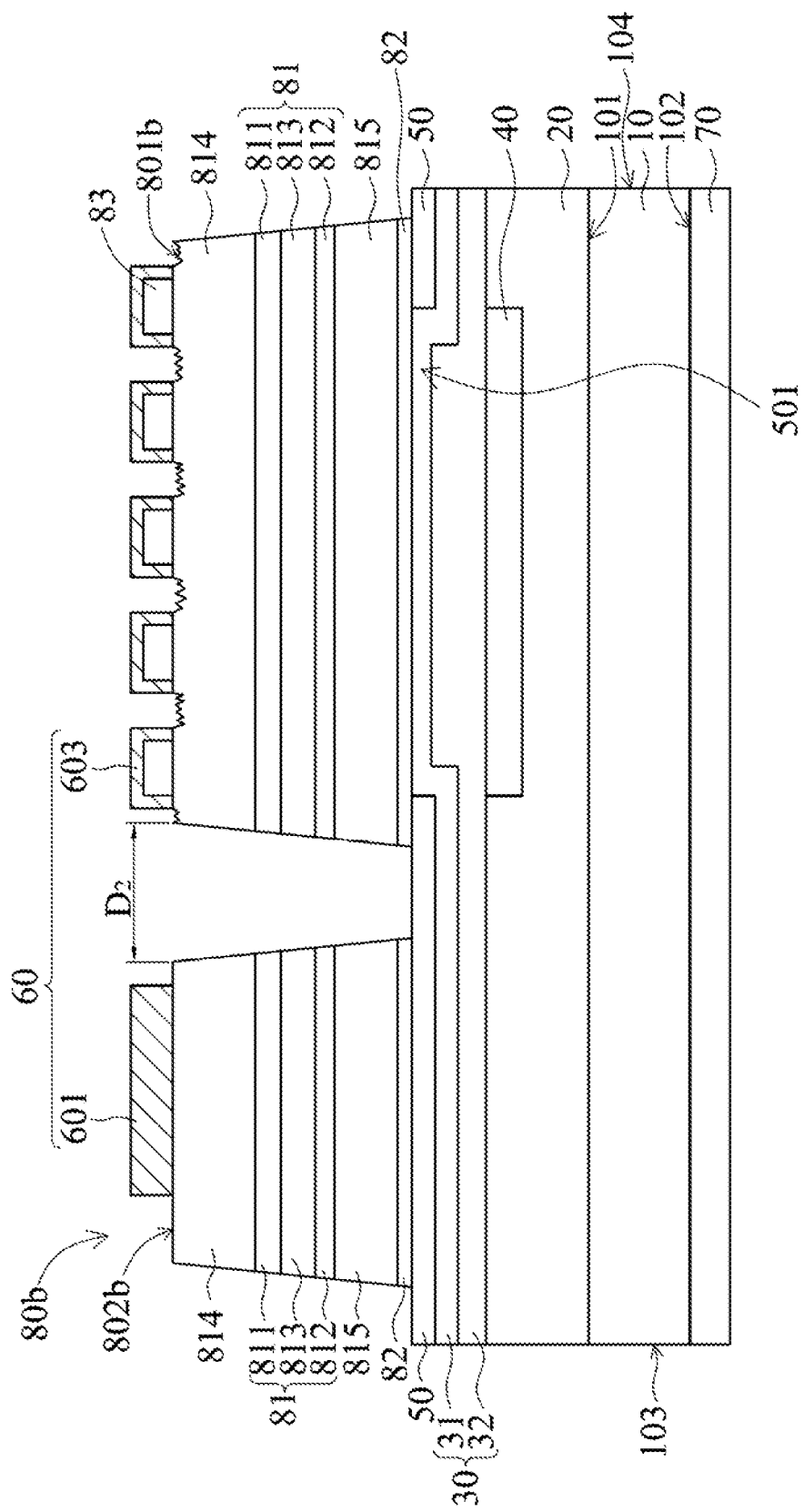
FIG. 1B is a cross-sectional diagram along an A-A' line of the light-emitting device according to the first embodiment of the present disclosure shown in FIG. 1A.
Figure 1C:
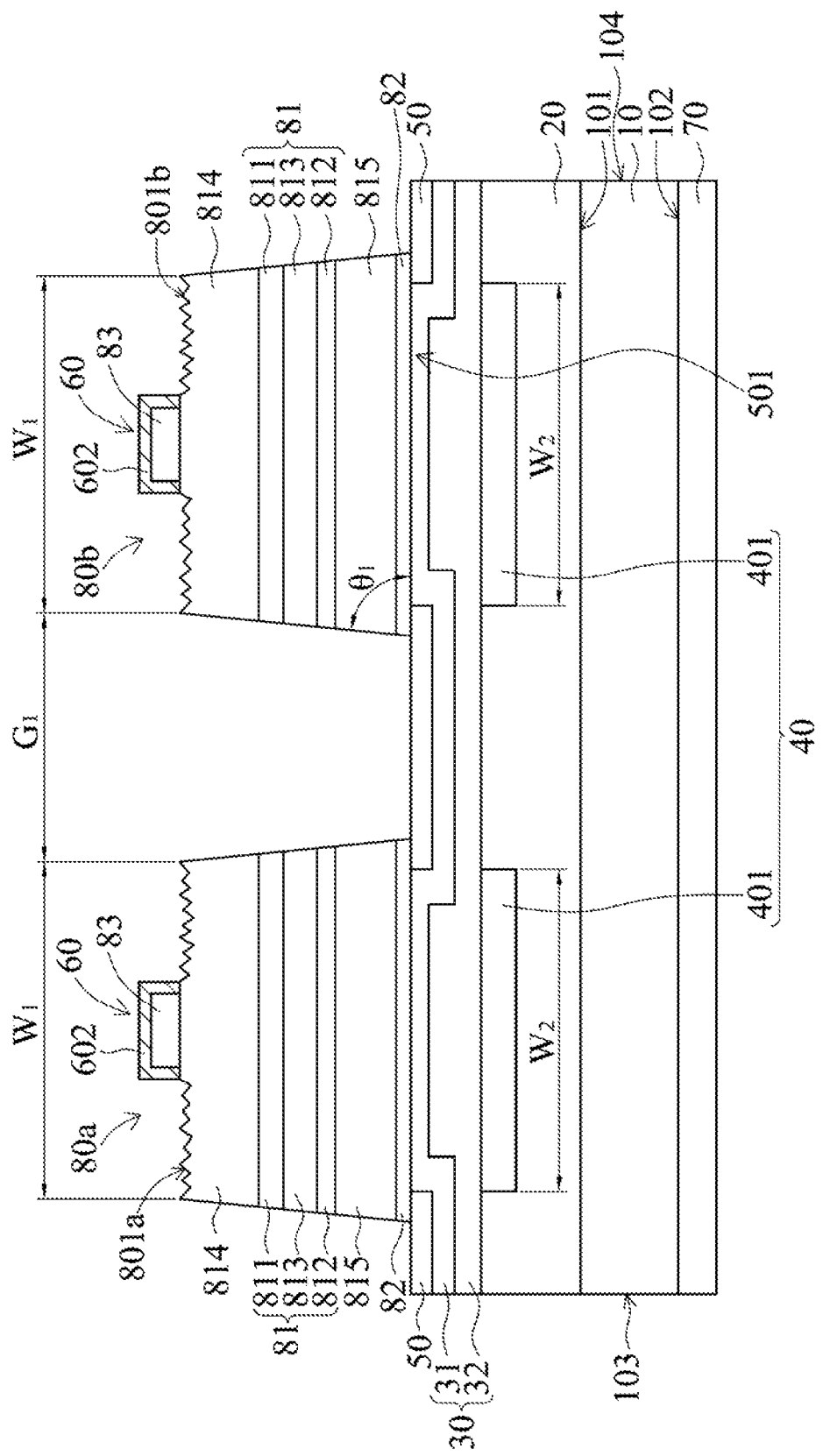
FIG. 1C is a cross-sectional diagram along a B-B' line of the light-emitting device according to the first embodiment of the present disclosure shown in FIG. 1A.
Figure 1D:
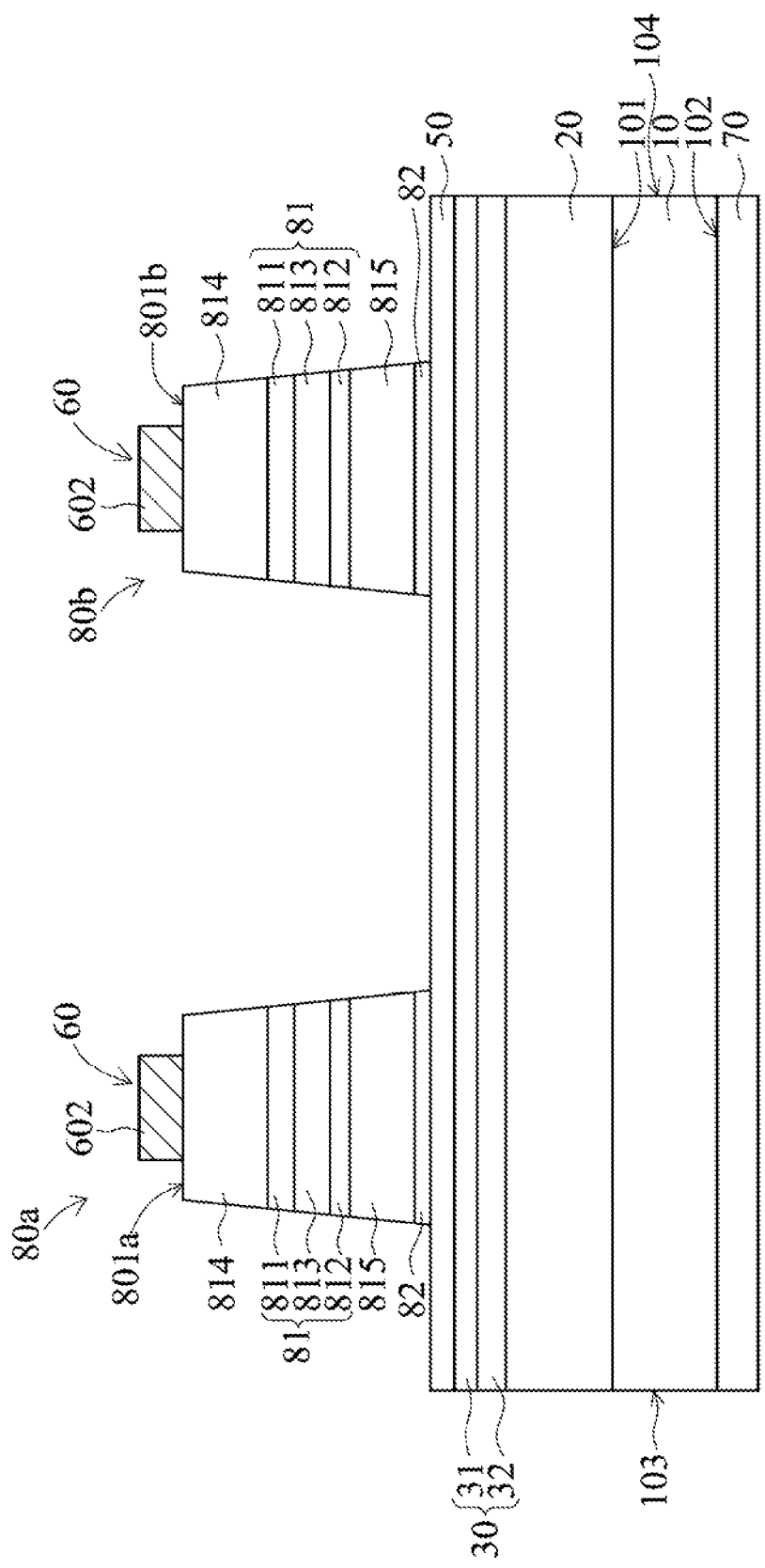
FIG. 1D is a cross-sectional diagram along a C-C' line of the light-emitting device according to the first embodiment of the present disclosure shown in FIG. 1A.

FIG. 1A is a top view of a light-emitting device according to a first embodiment of the present disclosure. FIG. 1B is a cross-sectional diagram along an A-A' line of the light-emitting device according to the first embodiment of the present disclosure shown in FIG. 1A. FIG. 1C is a cross-sectional diagram along a B-B' line of the light-emitting device according to the first embodiment of the present disclosure shown in FIG. 1A. FIG. 1D is a cross-sectional diagram along a C-C' line of the light-emitting device according to the first embodiment of the present disclosure shown in FIG. 1A. The light-emitting device comprises a substrate 10, a connecting layer 20, a contact layer 30, a reflector 40, a number N of semiconductor stacks 80, a blocking layer 50, a number N of first electrodes 60, and a second electrode 70. The substrate 10 comprises a first side 101 and a second side 102 opposite to the first side 101. The connecting layer 20 is on the first side 101 of the substrate 10. The contact layer 30 is on the connecting layer 20. The reflector 40 is between the connecting layer 20 and the contact layer 30. Each of N semiconductor stacks 80 is separated from each other and is on the contact layer 30. The blocking layer 50 is between the N semiconductor stacks 80 and the contact layer 30. N first electrodes 60 are on the N semiconductor stacks 80 respectively. The second electrode 70 is on the second side 102 of the substrate 10. In the present embodiment, the number N is 2. That is, the light-emitting device comprises a first semiconductor stack 80a and a second semiconductor stack 80b separated from the first semiconductor stack 80a. In the present embodiment, the shape of the first semiconductor stack 80a is, but not limited to, substantially the same as that of the second semiconductor stack 80b. In another embodiment, the shape of the first semiconductor stack 80a is a mirror image of the shape of second semiconductor stack 80b.

Referring to FIG. 1A, the substrate 10 further comprises a first side wall 103, a second side wall 104 opposite to the first side wall 103, a third side wall 105, and a fourth side wall 106 between the first side wall 103 and the second side wall 104. In the present embodiment, the length of the third side wall 105 is, but is not limited to, greater than the length of the first side wall 103 or the length of the second side wall 104. The length of the fourth side wall 106 is, but is not limited to, greater than the length of the first side wall 103 or the length of the second side wall 104. Each of the first electrodes 60 comprises an electrode pad 601, a first extension 602, and multiple second extensions 603. The electrode pad 601 is closer to the first side wall 103 than the second side wall 104. The first extension 602 extends from the electrode pad 601 toward a direction away from the electrode pad 601 or a direction toward the second side wall 104. The electrode pad 601 may connect to a power supply by a conductor. The conductor comprises a bonding wire. Each of the second extensions 603 extends from the first extension 602 toward the third side wall 105 and the fourth side wall 106. In one embodiment, an angle θ is between each second extension 603 and the first extension 602. The angle θ is between 80 degrees and 100 degrees for increasing current spreading. In the present embodiment, the angle θ is 90±5 degrees. The first semiconductor stack 80a comprises a first light extraction area 801a, a first electrode pad area 802a separated from the light extraction area 801a, and a first connecting area 803a connecting the first light extraction area 801a and the first bonding area 802a. The width of the first electrode pad area 802a is greater than the width of the first connecting area 803a. Specifically, a difference between the width of the first electrode pad area 802a and the width of the first connecting area 803a is greater than 40 μm, and preferably, greater than 60 μm, and more preferably, greater than 90 μm. The second semiconductor stack 80b comprises a second light extraction area 801b, a second electrode pad area 802b separated from the second light extraction area 801b, and a second connecting area 803b connecting the second light extraction area 801b and the second bonding area 802b. The width of the second electrode pad area 802b is greater than the width of the second connecting area 803b. Specifically, a difference between the width of the second electrode pad area 802b and the width of the second connecting area 803b is greater than 40 μm, and preferably, greater than 60 μm, and more preferably, greater than 90 μm. Specifically, the width is determined along a direction perpendicular to the extension direction of the first extension 602. The first light extraction area 801a and the second light extraction area 801b are the main light extraction areas of the light-emitting device. A distance between the first semiconductor stack 80a and the second semiconductor stack 80b is not greater than 20 μm, and preferably, not greater than 10 μm. Specifically, a distance $G_1$ between the first light extraction area 801a and the second light extraction area 801b, is not greater than 20 μm, and preferably, not greater than 10 μm. Preferably, the distance $G_1$ between the first light extraction area 801a and the second light extraction area 801b is the distance between the top of the sidewall of the first light extraction area 801a and the top of the sidewall of the first light extraction area 801b. The two electrode pads 601 are on the first electrode pad area 802a and the second electrode pad area 802b respectively. The area of each of the electrode pads 601 is less than the area of the corresponding electrode pad. Preferably, a distance between a sidewall of the first electrode pad area 802a and a sidewall of the corresponding electrode pad 601 is not less than 3 μm. A distance between a sidewall of the second electrode pad area 802b and a sidewall of the corresponding electrode pad 601 is not less than 3 μm. The first extension 602 on the first semiconductor stack 80a extends from the electrode pad 601 on the first electrode pad area 802a along the first connecting area 803a to the first light extraction area 801a of the first semiconductor stack 80a. The first extension 602 on the second semiconductor stack 80b extends from the electrode pad 601 on the second electrode pad area 802b along the second connecting area 803b to the second light extraction area 801b of the second semiconductor stack 80b. In the present embodiment, the first connecting area 803a comprises a length, which is a first distance $D_1$ between the first light extraction area 801a and the first electrode pad area 802a. The second connecting area 803b comprises a length, which is a second distance $D_2$ between the second light extraction area 801b and the second electrode pad area 802b. The first distance $D_1$ and the second distance $D_2$ is not less than 3% of the length of the third side wall 105, and is not greater than 25% of the length of the third side wall 105. In the present embodiment, the first distance $D_1$ and the second distance $D_2$ are substantially the same. In another embodiment, the first distance $D_1$ is different from the second distance $D_2$.

Referring to FIG. 1B, each of the first semiconductor stack 80a and the second semiconductor stack 80b comprises a light-emitting stack 81, a first semiconductor contact layer 82, and a second semiconductor contact layer 83. The first semiconductor contact layer 82 is between the light-emitting stack 81 and the contact layer 30. In the present embodiment, viewing along the stacking direction of the light-emitting stack 81, the shape of the first semiconductor contact layer 82 is substantially the same as the shape of the light-emitting stack 81. The second semiconductor contact layer 83 is between light-emitting stack 81 and the first electrode 60. Preferably, the second semiconductor contact layer 83 is only on the first light extraction area 801a and the second light extraction area 801b. Specifically, referring to FIGS. 1B to 1D, the second semiconductor contact layer 83 is only between the second extensions 603 and the light-emitting stack 81 and only between the first extension 602 on the light extraction areas 801a, 801b and the light-emitting stack 81. Specifically, the second semiconductor contact layer 83 is not between the first extension 602 on the first connecting area 803a and the light-emitting stack 81 and is not between the first electrode pad area 802a and the corresponding electrode pad 601. Besides, the second semiconductor contact layer 83 is not between the first extension 602 on the second connecting area 803b and the light-emitting stack 81 and is not between the second electrode pad area 802b and the corresponding electrode pad 601. By this design, current flowing from the electrode pad 601 flows into the multiple second extensions 603 through the first extension 602, and then flows into the light-emitting stack 81 through the second semiconductor contact layer 83, which is under the multiple second extensions 603, and under the first extension 602 on the first light extraction area 801a and on the second light extraction area 801b. The current does not directly flow into the first electrode pad area 802a and the second electrode pad area 802b. As a result, the current is concentrated on the first light extraction area 801a and the second light extraction area 801b. Therefore, the light-emitting efficiency of the light-emitting device of the present disclosure is improved. Besides, because a first distance $D_1$, which is the length of the first connecting area 803a, is between the first light extraction area 801a and the first electrode pad area 802a, and because a second distance $D_2$, which is the length of the second connecting area 803b, is between the second light extraction area 801b and the second electrode pad area 802b, when the light-emitting stack 81 of the first semiconductor stack 80a and the light-emitting stack 81 of the second semiconductor stack 80b emit the first light and the second light respectively, the problem of light leakage around the first electrode pad area 802a and the second electrode pad area 802b is alleviated or solved, wherein the light leakage is caused by the light emitted from the first light extraction area 801a entering the sidewall of the first electrode pad area 802a near the first light extraction area 801a and then escaping from the first electrode pad area 802a, and caused by the light emitted from the second light extraction area 801b entering the sidewall of the second electrode pad area 802b near the second light extraction area 801b and then escaping from the second electrode pad area 802b. Furthermore, when the first electrode pad area 802a and the second electrode pad area 802b are connected to a conductor, the problem of the conductor reflecting the light emitted from the first light extraction area 801a and the second light extraction area 801b is alleviated or solved.

Referring to FIG. 1B, the light-emitting stack 81 comprises a first semiconductor layer 811, a second semiconductor layer 812, and an active region 813 between the first semiconductor layer 811 and the second semiconductor layer 812. The active region 813 comprises a single heterostructure (SH), a double heterostructure (DH), a double-side double heterostructure (DDH) or a multi-quantum well (MQW) structure. In the present embodiment, the active region 813 comprises a MQW structure. The MQW structure comprises multiple alternate well layers and barrier layers. Each of the barrier layers has a band gap greater than the band gap of any one of the well layers. The first semiconductor layer 811 and the second semiconductor layer 812 are of different conductivity types. In the present embodiment, the first semiconductor layer 811 is of n type for providing electrons, and the second semiconductor layer 812 is of p type for providing holes. The band gap of the first semiconductor layer 811 and the band gap of the second semiconductor layer 812 are both higher than the band gap of the active region 813 for confining the holes and/or the electrons in the active region 813. In the present embodiment, the active region 813 of the first semiconductor stack 80a emits a first light having a first peak wavelength $\lambda_1$. Most of the first light mainly escapes from the first light extraction area 801a. The active region 813 of the second semiconductor stack 80b emits a second light having a second peak wavelength $\lambda_2$. Most of the second light mainly escapes from the second light extraction area 801b. In one embodiment, the first light escaping from the first light extraction area 801a and the second light escaping from the second light extraction area 801b are both visible red light, and the first peak wavelength $\lambda_1$ is substantially the same as the second peak wavelength $\lambda_2$. Preferably, a difference between the first peak wavelength $\lambda_1$ and the second peak wavelength $\lambda_2$ is less than 10 nm. Preferably, the first peak wavelength $\lambda_1$ and the second peak wavelength $\lambda_2$ are between 580 nm and 790 nm both inclusive, and more preferably, between 600 nm and 670 nm both inclusive. In another embodiment, the first light escaping from the first light extraction area 801a and the second light escaping from the second light extraction area 801b are both invisible infrared light, and the first peak wavelength $\lambda_1$ is substantially the same as the second peak wavelength $\lambda_2$. Preferably, a difference between the first peak wavelength $\lambda_1$ and the second peak wavelength $\lambda_2$ is less than 10 nm. Preferably, the first peak wavelength $\lambda_1$ and the second peak wavelength $\lambda_2$ are between 730 nm and 160 nm both inclusive, and more preferably, between 800 nm and 1000 nm both inclusive. In another embodiment, the first peak wavelength $\lambda_1$ is different from the second peak wavelength $\lambda_2$. For example, the first light escaping from the first light extraction area 801a is visible red light, the first peak wavelength $\lambda_1$ is between 580 nm and 790 nm both inclusive, and more preferably, between 600 nm and 670 nm both inclusive. The second light escaping from the second light extraction area 801b is invisible light, the second peak wavelength $\lambda_2$ is between 730 nm and 1600 nm both inclusive, and more preferably, between 800 nm and 1000 nm both inclusive. The first semiconductor layer 811 and the second semiconductor layer 812 comprise Group III-V semiconductor material, such as AlGaAs, AlInP or AlGaInP. In the present disclosure, the multiple semiconductor stacks can be independently controlled during operation and thus the multiple semiconductor stacks can independently emit light. Preferably, when the first electrode 60 on the first semiconductor stack 80a and the second electrode 70 are connected to a power supply at the same time, and the first electrode 60 on the second semiconductor stack 80b is not connected to the power supply, the active region 813 of the first semiconductor stack 80a emits the first light, and the active region 813 of the second semiconductor stack 80b does not emit the second light. Alternatively, when the first electrode 60 on the first semiconductor stack 80a, the first electrode 60 on the second semiconductor stack 80b, and the second electrode 70 are all connected to a power supply at the same time, the active region 813 of the first semiconductor stack 80a and the active region 813 of the second semiconductor stack 80b can emit the first light and the second light respectively at the same time.

Referring to FIGS. 1B to 1D, the reflector 40 is at a position corresponding to the position of the first light extraction area 801a and the second light extraction area 801b. That is, the reflector 40 overlaps with the first light extraction area 801a and the second light extraction area 801b along the stacking direction of the light-emitting stack 81, wherein the stacking direction of the light-emitting stack 81 vertical in the present embodiment. In the present embodiment, the shape of the reflector 40 is substantially the same as the shape of the first light extraction area 801a and the shape of the second light extraction area 801b. Referring to FIG. 1C, the reflector 40 comprises multiple subreflectors 401 separated from each other. In the present embodiment, the reflector 40 comprises two subreflectors 401 right under the first light extraction area 801a and the second light extraction area 801b respectively. As shown in FIG. 1C, each of the first light extraction area 801a and the second light extraction area 801b comprises a first width $W_1$, and each of the subreflectors 401 comprises a second width $W_2$ less than the first width $W_1$. Preferably, a difference between the second width $W_2$ and the first width $W_1$ is not less than 1 μm, and more preferably, not greater than 15 μm, and more preferably, between 2 and 10 μm both inclusive. In the present embodiment, the first width $W_1$ of the first light extraction area 801a is substantially the same as the first width $W_1$ of the second light extraction area 801b. In the present embodiment, the first width $W_1$ is about 90 μm. In the present embodiment, the second widths $W_2$ of the subreflectors 401 are substantially the same. In another embodiment, the first width $W_1$ of the first light extraction area 801a is different from the first width $W_1$ of the second light extraction area 801b, and the second widths $W_2$ of the subreflectors 401 are also different. Besides, the second widths $W_2$ of the subreflector 401 right under the first light extraction area 801a is less than the first width $W_1$ of the first light extraction area 801a. The second widths $W_2$ of the subreflector 401 right under the second light extraction area 801b is less than the first width $W_1$ of the second light extraction area 801b. Since the reflector is at a position right under first light extraction area 801a and the second light extraction area 801b, when one of the semiconductor stacks 80 is independently controlled to emit the first light, for example, when the first semiconductor stack 80a is independently controlled to emit the first light from the light-emitting stack 81, the problem of the first light escaping from the second light extraction area 801b can be alleviated or solved. Besides, since the second widths $W_2$ of the subreflector 401 right under the first light extraction area 801a is less than the first width $W_1$ of the corresponding first light extraction area 801a, when the light-emitting stack 81 of the first semiconductor stack 80a and the light-emitting stack 81 of the second semiconductor stack 80b emit the first light and the second light respectively at the same time, the problem of light leakage from the sidewall of the first semiconductor stack 80a and the sidewall of the second semiconductor stack 80 can be alleviated or solved. Furthermore, if the second width $W_2$ of the subreflector 401 right under the first light extraction area 801a is larger than the first width $W_1$ of the corresponding first light extraction area 801a, the light leaks from the sidewall of the contact layer 30. In the present embodiment, as shown in FIG. 1C, the sidewall of the first light extraction area 801a is an inclined surface, and the sidewall of the second light extraction area 801b is an inclined surface. An angle $\theta_1$ is between each sidewall and the blocking layer 50. The angle $\theta_1$ is between 40 and 75 degrees both inclusive, and preferably, the between 45 and 70 degrees both inclusive.

Referring to FIGS. 1B to 1D, an opening 501 is formed through the blocking layer 50. The shape of the opening 501 is substantially the same as the shape of the reflector 40 when viewing along the stacking direction of the light-emitting stack 81. That is, the shape of the blocking layer 50 is complementary to the shape of the reflector 40. Specifically, the reflector 40 does not overlap with the blocking layer 50 along the stacking direction of the light-emitting stack 81. The blocking layer 50 comprises an outer sidewall. The outer sidewall of the blocking layer 50 is closer to the first side wall 103, the second side wall 104, the third side wall 105 and the fourth side wall 106 of the substrate 10 than the sidewall of the first semiconductor stack 80a is to the first side wall 103, the second side wall 104, the third side wall 105 and the fourth side wall 106 of the substrate 10. The outer sidewall of the blocking layer 50 is also closer to the first side wall 103, the second side wall 104, the third side wall 105 and the fourth side wall 106 of the substrate 10 than the sidewall of the second semiconductor stack 80b is. The sidewall of the first light extraction area 801a and the sidewall of the first electrode pad area 802a overlap with the blocking layer 50 along the stacking direction of the light-emitting stack 81. The sidewall of the second light extraction area 801b and the sidewall of the second electrode pad area 802b overlap with the blocking layer 50 along the stacking direction of the light-emitting stack 81. That is, as shown in FIG. 1C, at the position where the part of the first light extraction area 801*a* closer to the second side wall 104 lies and at the position where the part of the second light extraction area 801*b* closer to the second side wall 104 lies, a part of the blocking layer 50 is not covered by the first semiconductor stack 80*a* and by the second semiconductor stack 80*b* and thus is exposed. That is, the part of the blocking layer 50 is not vertically overlapped with the first semiconductor stack 80*a* and the second semiconductor stack 80*b* along the stacking direction. Besides, the blocking layer 50 is between the part of the contact layer 30 closer to the second side wall 104 and the light-emitting stacks 81. As a result, the problem of light leakage from the side wall of the contact layer 30 can be avoided or alleviated. In the present embodiment, the outer sidewall of the blocking layer 50, the first side wall 103, the second side wall 104, the third side wall 105 and the fourth side wall 106 of the substrate 10 are substantially coplanar. The blocking layer 50 comprises a material comprising an insulation material comprising benzocyclobutene (BCB), cyclic olefin copolymer (COC), fluorocarbon polymer, $SiN_x$, $CaF_2$, $SiO_x$ or $MgF_2$. A part of the contact layer 30 fills the opening 501 penetrating the blocking layer 50 and is in direct contact with the first semiconductor contact layer 82. In the present disclosure, since the light-emitting device comprises a blocking layer 50 between each semiconductor stack and the substrate 10, during the step of removing a part of the semiconductor stack to form a number of N of semiconductor stacks separated from each other, which will be described more specifically in the following paragraphs, the problem of over etching can be avoided or alleviated while without having semiconductor material remaining between the semiconductor stacks separated from each other. Accordingly, when one of the light-emitting stacks 81 is independently controlled to emit light, since there is no semiconductor material remaining between the semiconductor stacks separated from each other, a problem of the light escaping from the neighboring light extraction area through the remaining semiconductor material is avoided or alleviated. For example, when the light-emitting stacks 81 of the first semiconductor stack 80*a* is independently controlled to emit the first light, the problem of the first light escaping from the second light extraction area 801*b* can be avoided or alleviated. Besides, the problem of the light leakage through the side wall of the contact layer 30 can also be avoided or alleviated.

The second electrode 70 overlaps with the first electrodes 60 on the first semiconductor stack 80*a* and on the second semiconductor stack 80*b* along the stacking direction of the light-emitting stack 81. Specifically, the second electrode 70 overlaps with the electrode pad 601, the first extension 602 and the multiple second extensions 603 of the first electrode 60 on the first semiconductor stack 80*a* along the stacking direction of the light-emitting stack 81. The second electrode 70 also overlaps with the electrode pad 601, the first extension 602 and the multiple second extensions 603 of the first electrode 60 on the second semiconductor stack 80*b* along the stacking direction of the light-emitting stack 81. Preferably, the second electrode 70 overlaps with the first semiconductor stack 80*a* and the second semiconductor stack 80*b* along the stacking direction of the light-emitting stack 81.

Each of the first semiconductor stack 80*a* and the second semiconductor stack 80*b* comprises a third semiconductor layer 814 between the second semiconductor contact layer 83 and the first semiconductor layer 811. For improving current spreading through the light-emitting stack 81, the third semiconductor layer 814 has a thickness thicker than that of the first semiconductor layer 811 and has a band gap lower than the band gap of the first semiconductor layer 811. In one embodiment, the thickness of the third semiconductor layer 814, that is, the shortest distance between the surface of the third semiconductor layer 814 in direct contact with the second semiconductor contact layer 83 and the other surface of the third semiconductor layer 814 opposite to the second semiconductor contact layer 83, is not less than 2000 nm, and preferably, is between 2000 nm and 7000 nm both inclusive for increasing current spreading. In one embodiment, the third semiconductor layer 814 comprises an exposed part, which is not covered by the first electrode 60. The exposed part comprises a rough structure after a roughening step for reducing the total internal reflection at the interface between the third semiconductor layer 814 and the ambient environment. The roughness of the rough structure is between 1 µm and 5 µm both inclusive, and preferably, between 1 µm and 3 µm both inclusive. In one embodiment, the third semiconductor layer 814 comprises AlGaInP or AlGaAs. In the present embodiment, the third semiconductor layer 814 comprises n-type material.

Each of the first semiconductor stack 80*a* and the second semiconductor stack 80*b* further comprises a fourth semiconductor layer 815 between the first semiconductor contact layer 82 and the second semiconductor layer 812. For improving current spreading through the light-emitting stack 81, the fourth semiconductor layer 815 has a thickness thicker than that of the first semiconductor layer 811 and has a band gap lower than the band gap of the first semiconductor layer 811. In one embodiment, the thickness of the fourth semiconductor layer 815 is less than the thickness of the third semiconductor layer 814. Preferably, the thickness of the fourth semiconductor layer 815 is between 1000 and 4000 nm both inclusive. In one embodiment, the fourth semiconductor layer 815 comprises AlGaInP or AlGaAs. In the present embodiment, the fourth semiconductor layer 815 comprises p-type material.

Figure 2A:
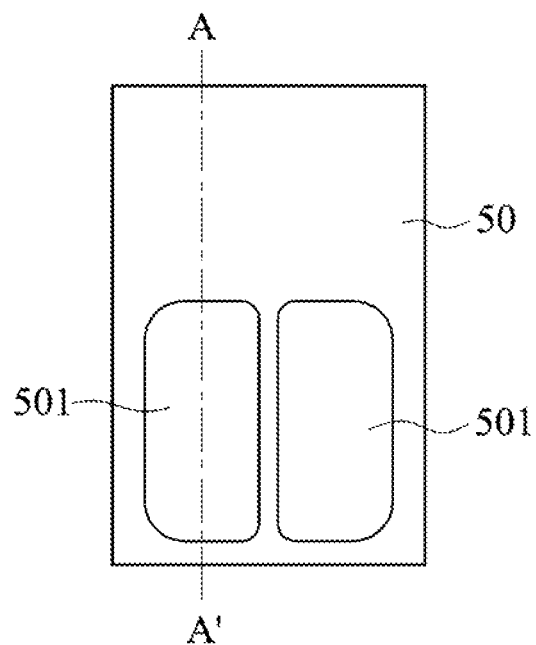
FIGS. 2A through 6B demonstrate the method for manufacturing the light-emitting device shown in FIGS. 1A through 1D.
Figure 2B:
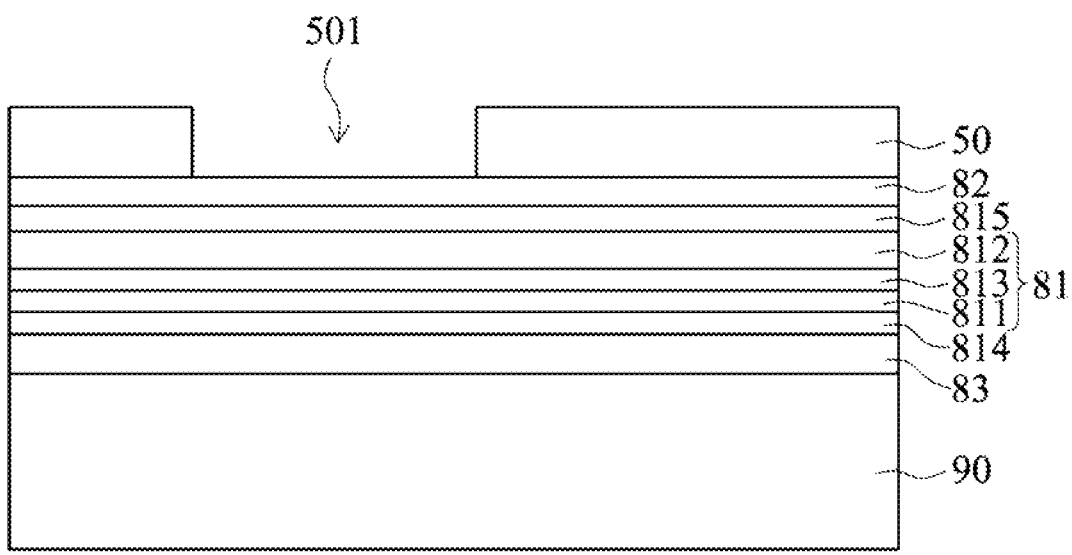
Figure 3A:
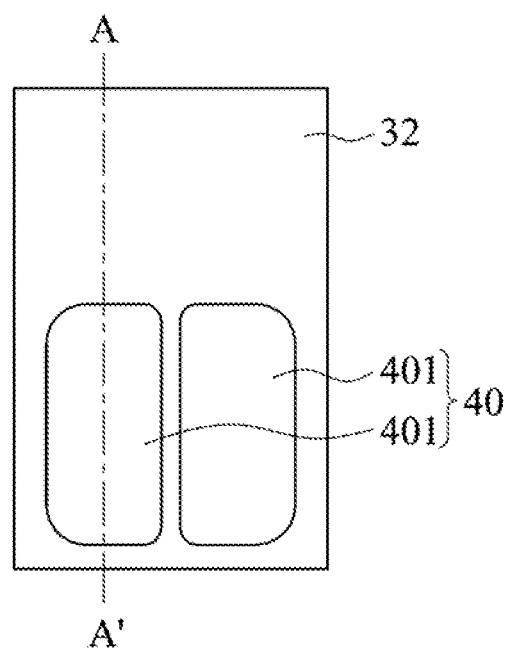
Figure 3B:
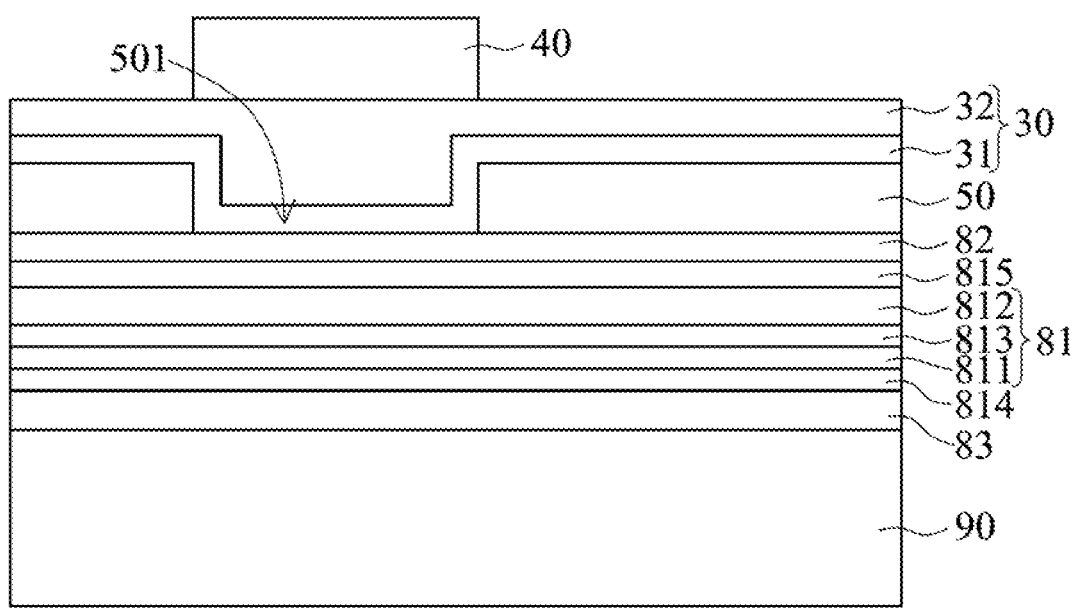
Figure 4:
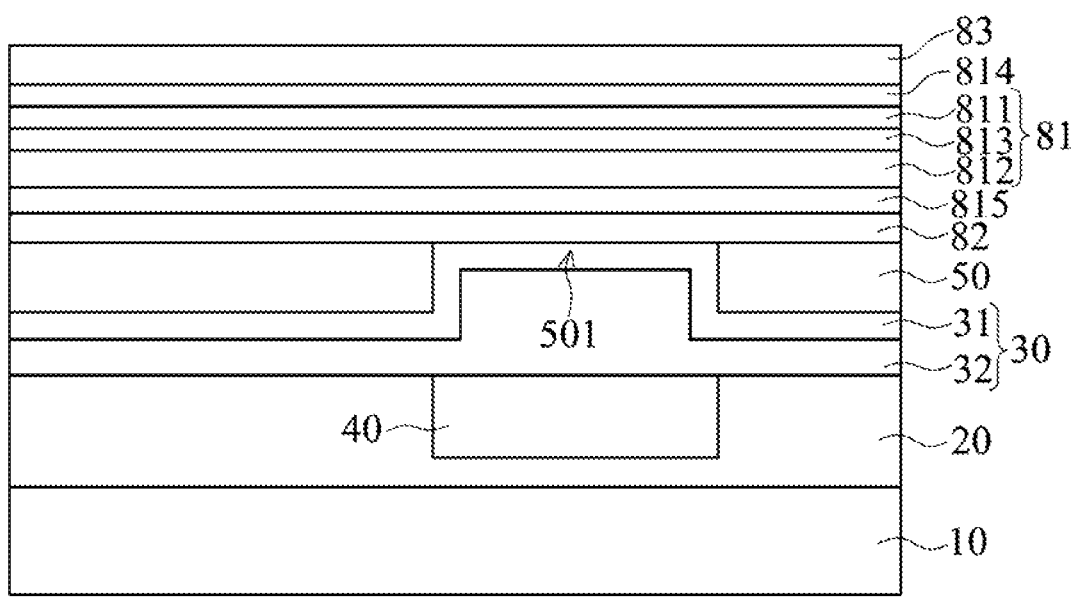
Figure 5A:
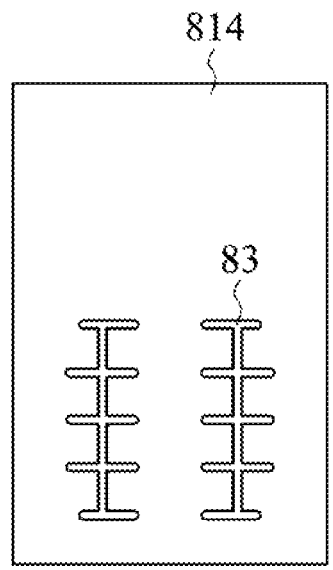
Figure 5B:
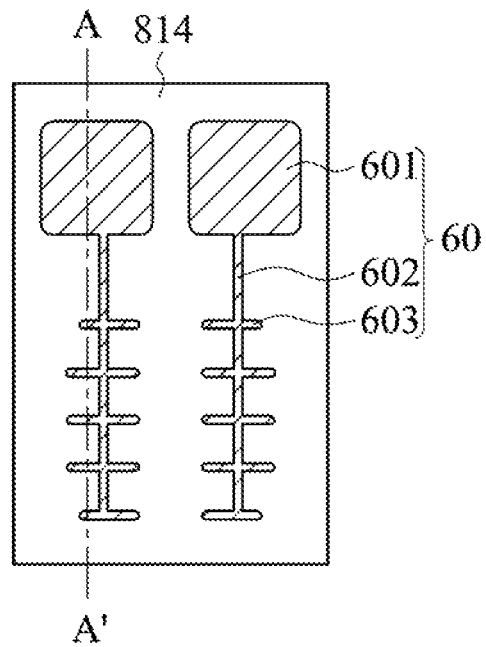
Figure 5C:
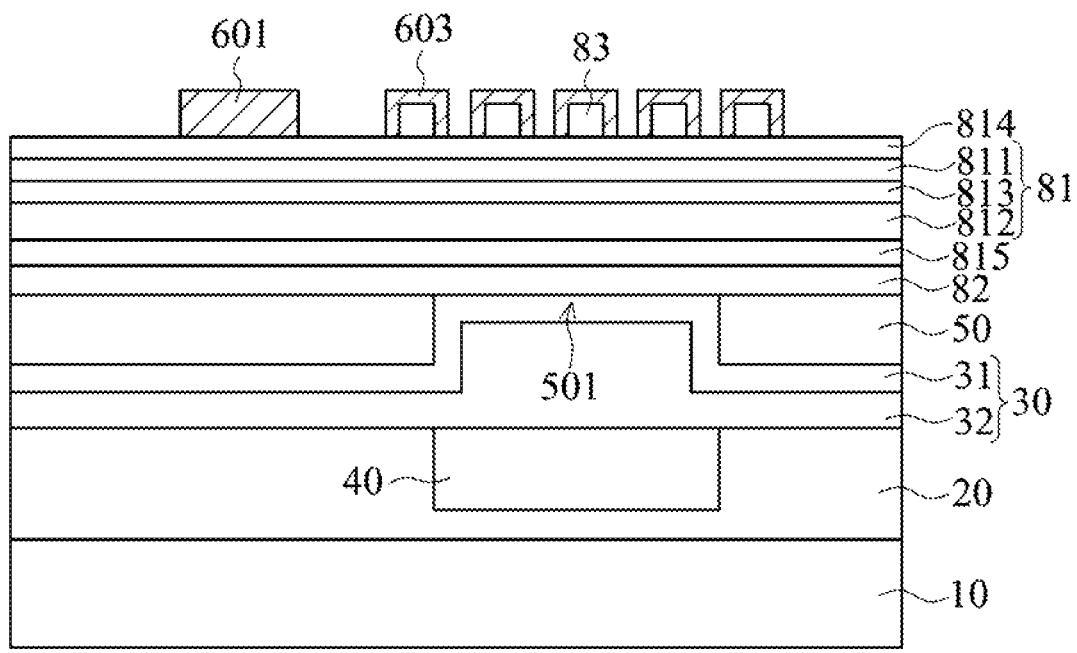
Figure 6A:
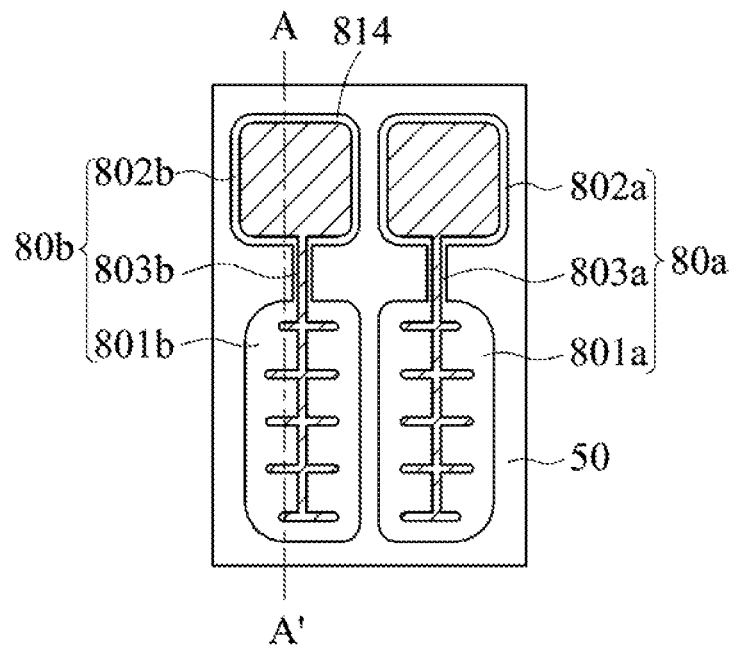
Figure 6B:
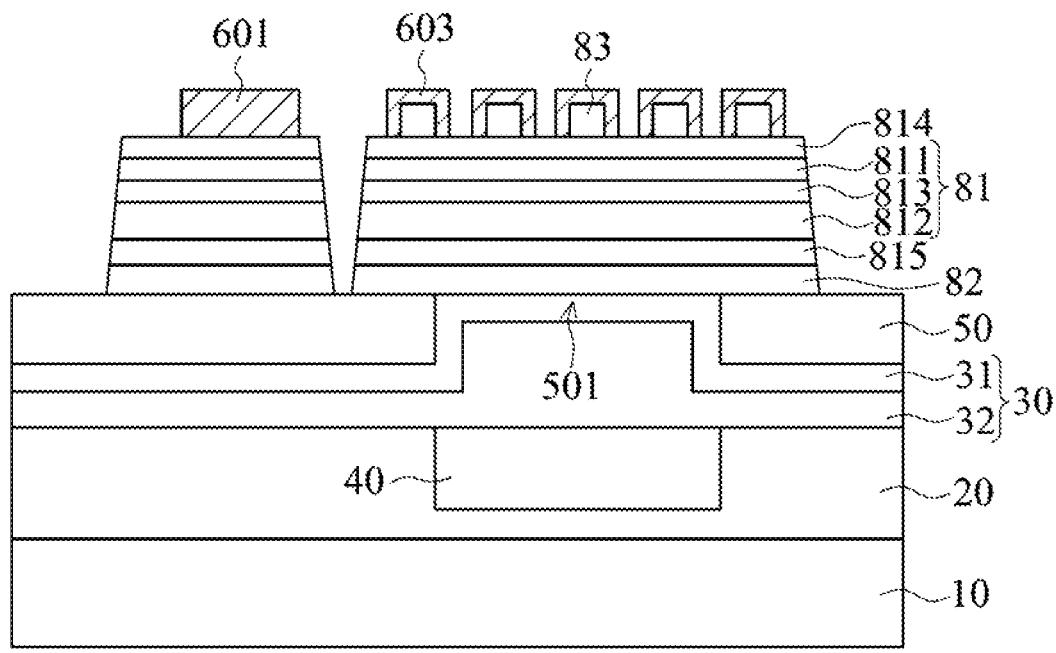

FIGS. 2A through 6B demonstrate the method for manufacturing the light-emitting device shown in FIGS. 1A through 1D. FIG. 2A is a top view of the unfinished light-emitting device after forming the blocking layer 50. FIG. 2B is a cross-sectional view along an A-A' line of the unfinished light-emitting device according to the first embodiment of the present disclosure shown in FIG. 2A. The method of the present embodiment for making a light-emitting device comprises: providing a growth substrate 90; forming a semiconductor stack on the growth substrate 90, wherein the semiconductor stack sequentially comprises a second semiconductor contact layer 83, a third semiconductor layer 814, a light-emitting stack 81, a fourth semiconductor layer 815, and a first semiconductor contact layer 82, and the method of forming the semiconductor stack comprises epitaxially growing a second semiconductor contact layer 83 third semiconductor layer 814, light-emitting stack 81, fourth semiconductor layer 815, first semiconductor contact layer 82 in sequence; forming a blocking layer 50 on the first semiconductor contact layer; and patterning the blocking layer 50 to form openings 501 through the blocking layer 50. FIG. 3A is a top view of the unfinished light-emitting device after forming the contact layer 30 and the reflector 40. FIG. 3B is a cross-sectional view along an A-A' line of the unfinished light-emitting device according to the first embodiment of the present disclosure shown in FIG. 3A. The method of the present embodiment for making a light-emitting device further comprises: forming a contact layer 30 to cover the blocking layer 50, wherein a part of the contact layer 30 is in the openings 501 to directly contact the first semiconductor contact layer 82; and forming a reflector 40 on the contact layer 30 so that the contact layer 30 is between the reflector 40 and the blocking layer 50, wherein the reflector 40 comprises multiple subreflectors 401, and each of the subreflectors 401 is right above one of the openings 501. FIG. 4 is a cross sectional view of the unfinished light-emitting device after connecting to a substrate 10. The method of the present disclosure for making a light-emitting device further comprises: connecting a substrate 10 and the contact layer 30 by a connecting layer 20; and removing the growth substrate 90. FIG. 5A is a top view of the unfinished light-emitting device after patterning the second semiconductor contact layer 83. FIG. 5B is a top view of the unfinished light-emitting device after forming the first electrode 60. FIG. 5C is a cross-sectional view along an A-A' line shown in FIG. 5B. Referring to FIG. 5A, the method of the present embodiment for making a light-emitting device further comprises: patterning the second semiconductor contact layer 83; and forming a first electrode 60 on the patterned second semiconductor contact layer 83 as shown in FIG. 5B. Referring to FIG. 5C, the second semiconductor contact layer 83 is patterned such that the a part of the second semiconductor contact layer 83 directly under the electrode pad 601 and directly under a part of the first extension 602 are removed. Besides, the multiple second extensions 603 of the first electrode 60 and other part of the first extension 602 cover the patterned second semiconductor contact layer 83. FIG. 6A is a top view of the unfinished light-emitting device after removing a part of the semiconductor stack. FIG. 6B is a cross-sectional view along an A-A' line shown in FIG. 6A. Referring to FIG. 6A, the method of the present embodiment for making a light-emitting device further comprises: removing a part of the semiconductor stack to form multiple semiconductor stacks separated from each other by dry etching or by any suitable methods, such as chemical etching or laser etching. In the present embodiment, a part of the semiconductor stack is removed to form a first semiconductor stack 80a and a second semiconductor stack 80b separated from the first semiconductor stack 80a as shown in FIG. 1B. Referring to FIG. 6B, since the blocking layer 50 is under the semiconductor stack, a problem of over etching the semiconductor stack, which may damage the contact layer 30 under the blocking layer 50, is avoided. As a result, the part of the semiconductor stack between the first semiconductor stack 80a and the second semiconductor stack 80b can be completely removed to separate the first semiconductor stack 80a and the second semiconductor stack 80b without damaging the contact layer 30. After the step of removing a part of the semiconductor stack to form multiple semiconductor stacks separated from each other, a part of the blocking layer 50 is not covered by the first semiconductor stack 80a and the second semiconductor stack 80b and thus is exposed. The method of the present embodiment for making a light-emitting device further comprises a step of roughing the exposed part of the third semiconductor layer 814, which is not covered by the first electrode 60, to form the rough structure as shown in FIG. 1B.

Figure 7A:
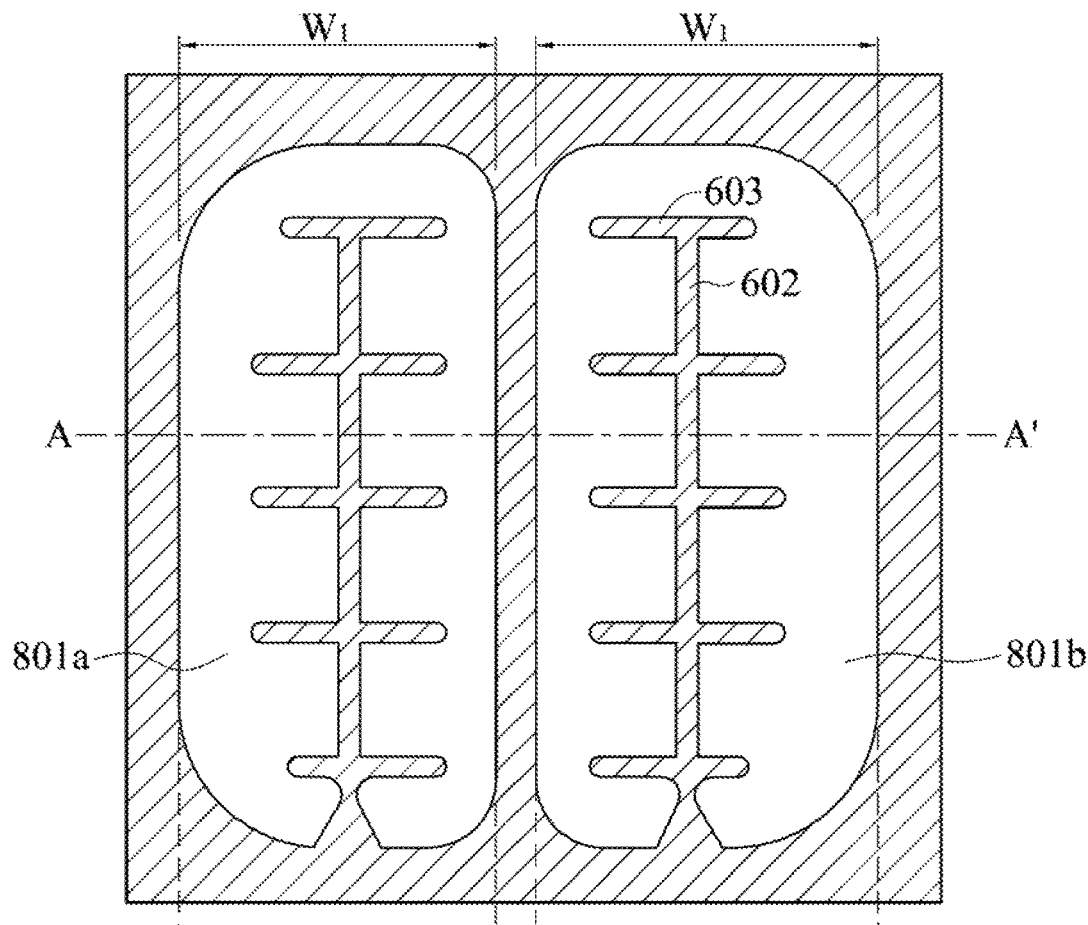
FIG. 7A is a diagram showing a near-field image of a part of the light-emitting device as shown in FIG. 1A when operated at a current of 40±5 mA.
Figure 7B:
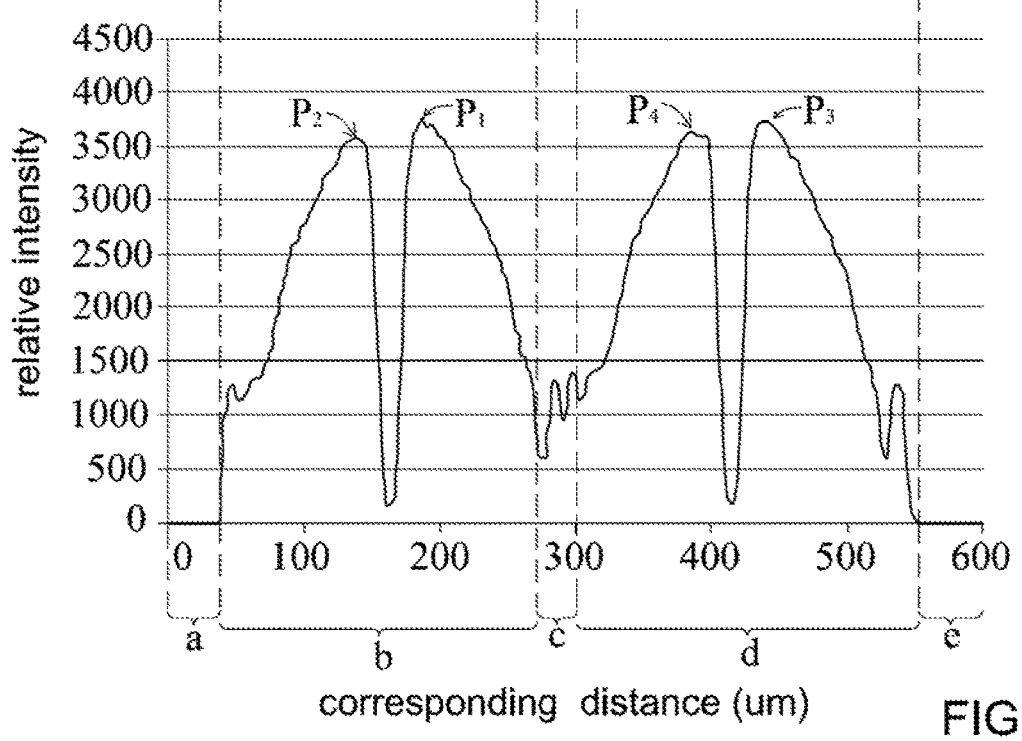
FIG. 7B is a diagram showing a relation between the relative intensity and the corresponding distance along an A-A' line shown in FIG. 7A.

FIG. 7A is a diagram showing a near-field image of a part of the light-emitting device shown in FIG. 1A when operated at a current of 40±5 mA. FIG. 7B is a diagram showing a relation between the relative intensity and the corresponding distance along an A-A' line shown in FIG. 7A. The diagram showing the relation between the relative intensity and the corresponding distance can be obtained by any suitable devices. In the present embodiment, the diagram is obtained by a device capable of measuring the near field light distribution of the light-emitting device. Referring to FIG. 7A, the luminous intensity of the part shown by oblique lines is lower than the luminous intensity of the other part shown without oblique lines. Referring to FIG. 7A and FIG. 7B, the light-emitting stack 81 of the first semiconductor stack 80a and the light-emitting stack 81 of the second semiconductor stack 80b emit the first light and the second light respectively at the same time. That is, the two first electrodes 60 and the second electrode 70 shown in FIG. 1A and FIG. 1B are connected to a power supply at the same time. Region marked as "a" shown in FIG. 7B represents a part of the area between the third side wall 105 and the first light extraction area 801a shown in FIG. 1A. Since the area between the third side wall 105 and the first light extraction area 801a is devoid of the active region 813, the relative intensity of the area a is 0. Region marked as "b" shown in FIG. 7B represents the area where the first light extraction area 801a lies as shown in FIG. 7A. The region b has a first peak value $P_1$ with a maximum relative intensity and a second peak value $P_2$ with a minimum relative intensity. The second peak value $P_2$ with the minimum relative intensity is the peak value with a minimum relative intensity between $2/3 \times P_1$ and the first peak value $P_1$. For example, in the present embodiment, in the region b, the first peak value $P_1$ is 3792, the peak value with a minimum relative intensity between $2/3 \times 3792$ and 3792 is 3616, which is the second peak value $P_2$. In the region b, the area between the first peak value $P_1$ and the second peak value $P_2$ and with a relative intensity lower than 500 is the position where the first extension 602 on the first light extraction area 801a lies. Region marked as "c" represents the area between the first light extraction area 801a and the second light extraction area 801b. Region marked as "d" shown in FIG. 7B represents the area where the second light extraction area 801b lies as shown in FIG. 7A. The region d has a first peak value $P_3$ with a maximum relative intensity and a second peak value $P_4$ with a minimum relative intensity. The second peak value $P_4$ with the minimum relative intensity is the peak value with a minimum relative intensity between $2/3 \times P_3$ and the first peak value $P_3$. For example, in the present embodiment, in the region d, the first peak value $P_3$ is 3792, the peak value with a minimum relative intensity between $2/3 \times 3792$ and 3792 is 3680, which is the second peak value $P_4$. In the region b, the area between the first peak value $P_3$ and the second peak value $P_4$ and with a relative intensity lower than 500 is the position where the first extension 602 on the second light extraction area 801b lies. Region marked as "e" shown in FIG. 7B represents a part of the area between the fourth side wall 106 and the second light extraction area 801b shown in FIG. 1A. Since the area between the fourth side wall 106 and the second light extraction area 801b is devoid of the active region 813, the relative intensity of the area e is 0. In the present disclosure, a ratio of the maximum relative intensity of the first light escaping from the first light extraction area 801a of the first semiconductor stack 80a to the maximum relative intensity of the second light escaping from the second light extraction area 801b of the second semiconductor stack 80b is not less than 0.8, and preferably, is not more than 1.2, and more preferably, is not less than 0.85, and more preferably, is not more than 1.15. In the present embodiment, the maximum relative intensity of the first light escaping from the first light extraction area 801a of the first semiconductor stack 80a is 3792, and the maximum relative intensity of the second light escaping from the second light extraction area 801b of the second semiconductor stack 80b is 3792. The ratio of the former one to the latter one is 1. Besides, in the present disclosure, a ratio of the maximum relative intensity of the first light escaping from the first light extraction area 801*a* of the first semiconductor stack 80*a* to the minimum relative intensity of the second light escaping from the second light extraction area 801*b* of the second semiconductor stack 80*b* is not less than 0.8, and preferably, is not more than 1.2, and more preferably, is not less than 0.85, and more preferably, is not more than 1.15. A ratio of the maximum relative intensity of the second light escaping from the second light extraction area 801*b* of the second semiconductor stack 80*b* to the minimum relative intensity of the first light escaping from the first light extraction area 801*a* of the first semiconductor stack 80*a* is not less than 0.8, and preferably, is not more than 1.2, and more preferably, is not less than 0.85, and more preferably, is not more than 1.15. In the present embodiment, the maximum relative intensity of the first light escaping from the first light extraction area 801*a* of the first semiconductor stack 80*a* is 3792, the minimum relative intensity of the second light escaping from the second light extraction area 801*b* of the second semiconductor stack 80*b* is 3680, and the ratio of the former one to the latter one is 1.03. In the present embodiment, the maximum relative intensity of the second light escaping from the second light extraction area 801*b* of the second semiconductor stack 80*b* is 3792, the minimum relative intensity of the first light escaping from the first light extraction area 801*a* of the first semiconductor stack 80*a* is 3616, and the ratio of the former one to the latter one is 1.05. In another embodiment, an average of the first peak value $P_1$ of the first light extraction area 801*a*, the second peak value $P_2$ of first light extraction area 801*a*, the first peak value $P_3$ of the second light extraction area 801*b* and the second peak value $P_4$ of the second light extraction area 801*b* is A. A ratio of the peak value with the maximum relative intensity among the four peak values to the average A is between 1 and 1.2, and preferably, between 1 and 1.1. For example, in the present embodiment, the average A is 3720, which is obtained by (3792+3792+3680+3616)/4. The peak value with the maximum relative intensity among the four peak values is 3792. 3792/3720 is 1.02. Accordingly, the light distribution of the light-emitting device comprising multiple semiconductor stacks is even when all of the semiconductor stacks emit light at the same time.

Figure 7C:
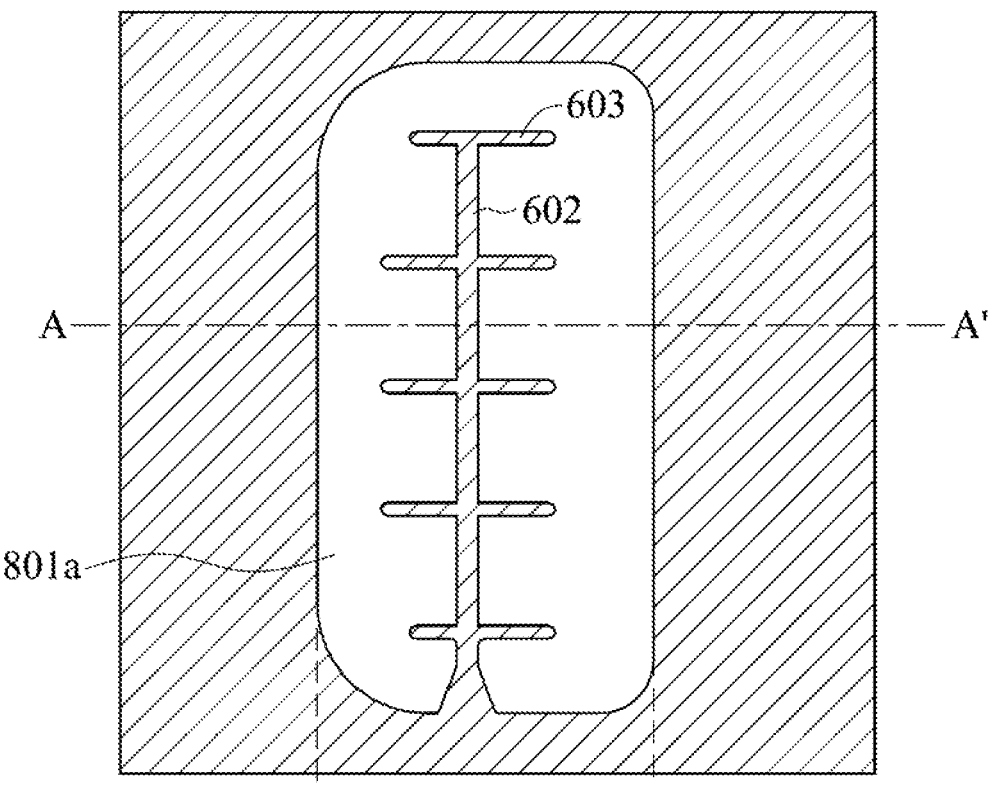
FIG. 7C is a diagram showing a near-field image of a part of the light-emitting device as shown in FIG. 1A when operated at a current of 40±5 mA.
Figure 7D:
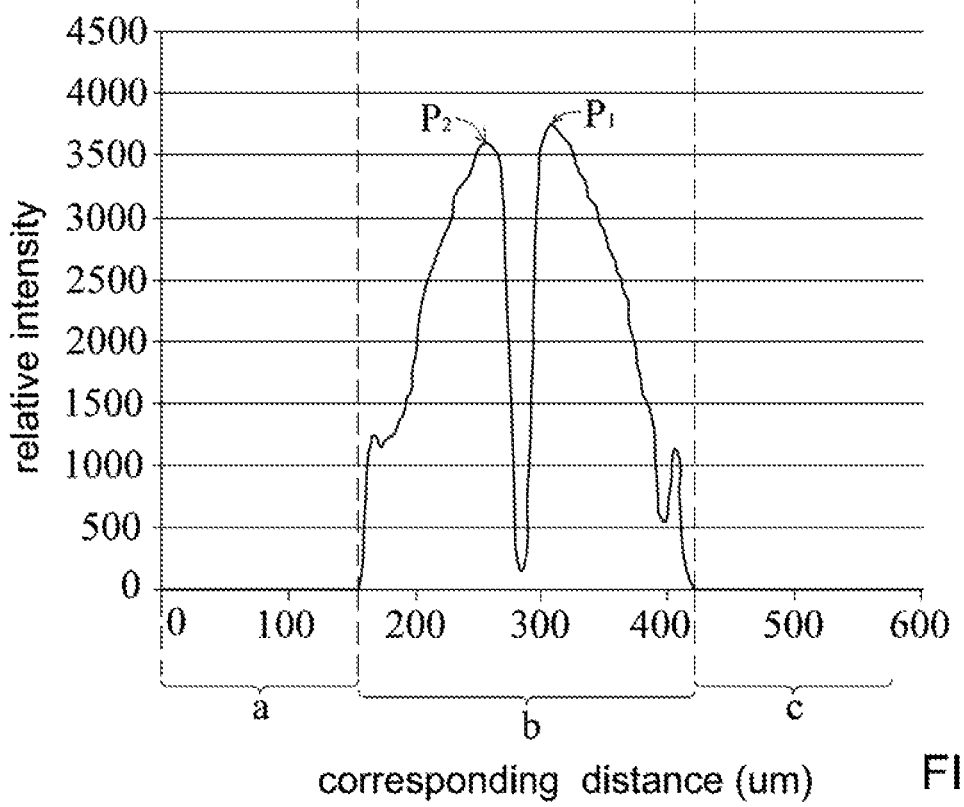
FIG. 7D is a diagram showing a relation between the relative intensity and the corresponding distance along an A-A' line shown in FIG. 7A.
Figure 7E:
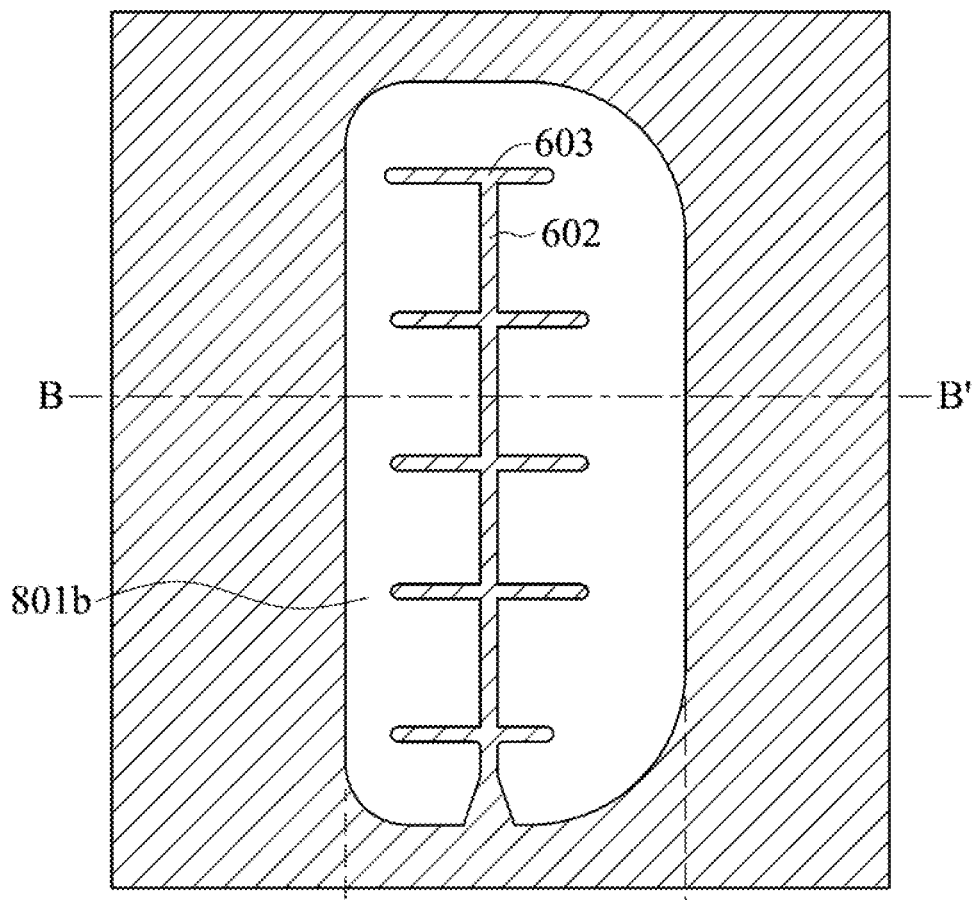
FIG. 7E is a diagram showing a near-field image of a part of the light-emitting device as shown in FIG. 1A when operated at a current of 40±5 mA.
Figure 7F:
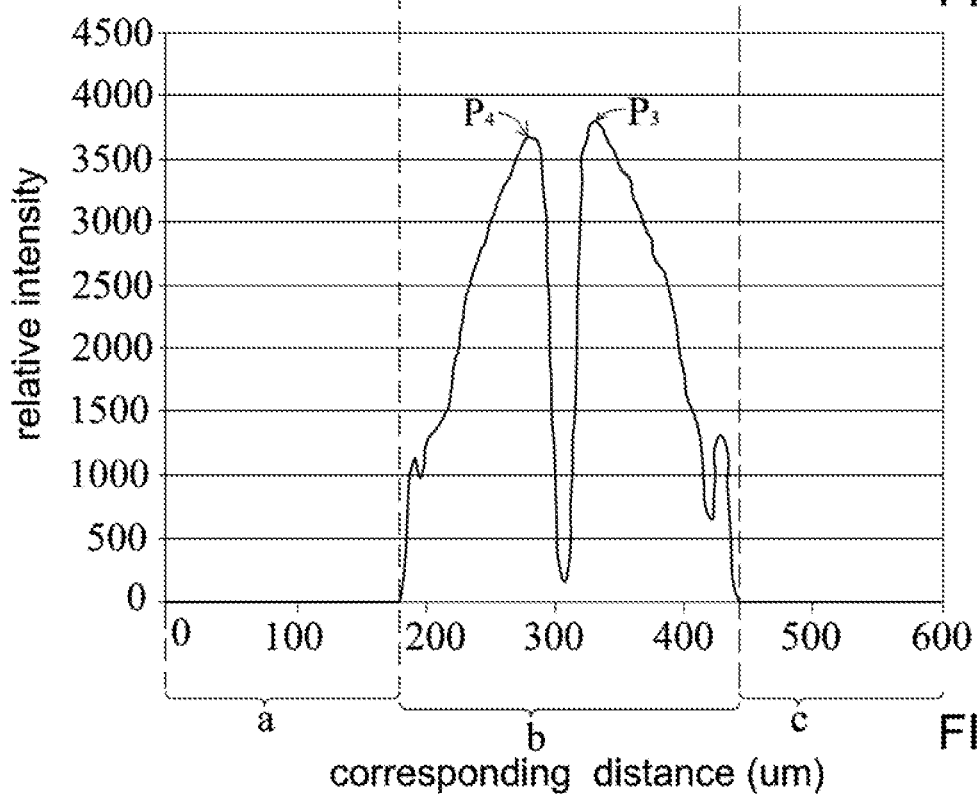
FIG. 7F is a diagram showing a relation between the relative intensity and the corresponding distance along a B-B' line shown in FIG. 7E.

FIG. 7C is a diagram showing a near-field image of a part of the light-emitting device as shown in FIG. 1A when operated at a current of 40±5 mA. Referring to FIG. 7C, the luminous intensity of the part shown by oblique lines is lower than the luminous intensity of the other part shown without oblique lines. FIG. 7D is a diagram showing a relation between the relative intensity and the corresponding distance along an A-A' line shown in FIG. 7A. Referring to FIG. 7C and FIG. 7D, the first electrode 60 on the first semiconductor stack 80*a* and the second electrode 70 as shown in FIG. 1A are connected to a power supply at the same time while the first electrode 60 on the second semiconductor stack 80*b* is not connected to the power supply. That is, the light-emitting stack 81 of the first semiconductor stack 80*a* is independently controlled to emit the first light while the light-emitting stack 81 of the second semiconductor stack 80*b* does not emit the second light. Referring to FIG. 7D, region marked as "a" represents a part of the area between the third side wall 105 and the first light extraction area 801*a* shown in FIG. 7C. Since the area between the third side wall 105 and the first light extraction area 801*a* is devoid of the active region 813, the relative intensity of the area "a" is 0. Region marked as "b" shown in FIG. 7D represents the area where the first light extraction area 801*a* lies as shown in FIG. 7C. Region marked as "c" represents the area between the first light extraction area 801*a* and the second light extraction area 801*b* and a part of the second light extraction area 801*b* as shown in FIG. 1A. Region marked as "d" shown in FIG. 7B represents the area where the second light extraction area 801*b* lies as shown in FIG. 7A. As shown in FIG. 7D, when the first semiconductor stack 80*a* is independently controlled to emit the first light, the first light barely escapes from the second light extraction area 801*b* of the second semiconductor stack 80*b*. Specifically, when the first semiconductor stack 80*a* is independently controlled to emit the first light, a ratio of the maximum relative intensity of the first light escaping from the second light extraction area 801*b* to the maximum relative intensity of the first light escaping from the first light extraction area 801*a*, which is the first peak value P1 shown in FIG. 7D, is less than 0.1, and preferably, less than 0.08, and more preferably, less than 0.05. In the present embodiment, the maximum relative intensity of the first light escaping from the second light extraction area 801*b* is 0, and the first light escaping from the first light extraction area 801*a*, which is the first peak value P1, is 3792. A ratio of the former maximum relative intensity to the latter one is 0. FIG. 7E is a diagram showing a near-field image of a part of the light-emitting device as shown in FIG. 1A when operated at a current of 40±5 mA. Referring to FIG. 7E, the luminous intensity of the part shown by oblique lines is lower than the luminous intensity of the other part shown without oblique lines. FIG. 7F is a diagram showing a relation between the relative intensity and the corresponding distance along a B-B' line shown in FIG. 7E. The first electrode 60 on the second semiconductor stack 80*b* and the second electrode 70 as shown in FIG. 1A are connected to a power supply at the same time while the first electrode 60 on the first semiconductor stack 80*a* is not connected to the power supply. That is, the light-emitting stack 81 of the second semiconductor stack 80*b* is independently controlled to emit the second light while the light-emitting stack 81 of the first semiconductor stack 80*a* does not emit the first light. Referring to FIG. 7F, region marked as "a" shown in FIG. 7F represents the area of a part of the first light extraction area 801*a* and the area between first light extraction area 801*a* and the second light extraction area 801*b* as shown in FIG. 1A. Region marked as "b" shown in FIG. 7F represents the area where the second light extraction area 801*b* lies as shown in FIG. 7E. Region marked as "c" represents a part of the area between the fourth side wall 106 and the second light extraction area 801*b* as shown in FIG. 1A. Referring to FIG. 7F, since the area between the fourth side wall 106 and the second light extraction area 801*b* is devoid of the active region 813, the relative intensity of the area "c" is 0. As shown in FIG. 7F, when the second semiconductor stack 80*b* is independently controlled to emit the second light, the second light barely escapes from the first light extraction area 801*a* of the first semiconductor stack 80*a*. Specifically, when the second semiconductor stack 80*b* is independently controlled to emit the second light, a ratio of the maximum relative intensity of the second light escaping from the first light extraction area 801*a* to the maximum relative intensity of the second light, which is the first peak value $P_3$ shown in FIG. 7F, escaping from the second light extraction area 801*b* is less than 0.1, and preferably, less than 0.08, and more preferably, less than 0.05. In the present embodiment, the maximum relative intensity of the second light escaping from the first light extraction area 801*a* is 0, and the second light escaping from the second light extraction area 801*b*, which is the first peak value P3, is 3792. A ratio of the former maximum relative intensity to the latter one is 0. Accordingly, when each of the light-emitting stacks 81 of the light-emitting device of the present disclosure is independently controlled to emit light, a problem of the light escaping from the neighboring light extraction area or a problem of crosstalk can be alleviated or avoided.

Figure 7G:
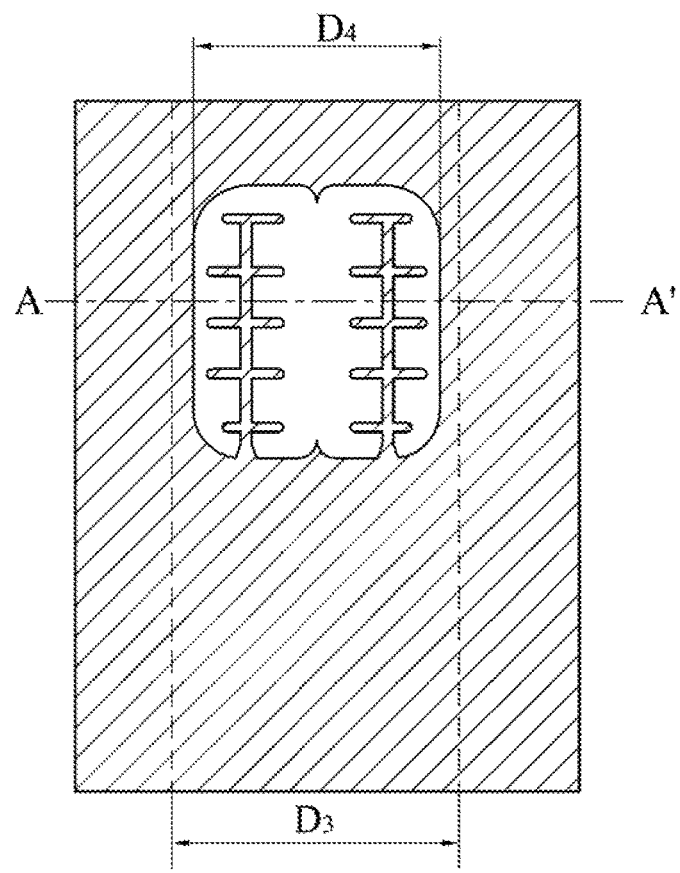
FIG. 7G is a diagram showing a near-field image of the light-emitting device as shown in FIG. 1A and the surrounding environment of the light-emitting device, wherein the light-emitting device is operated at a current of 40±5 mA.
Figure 7H:
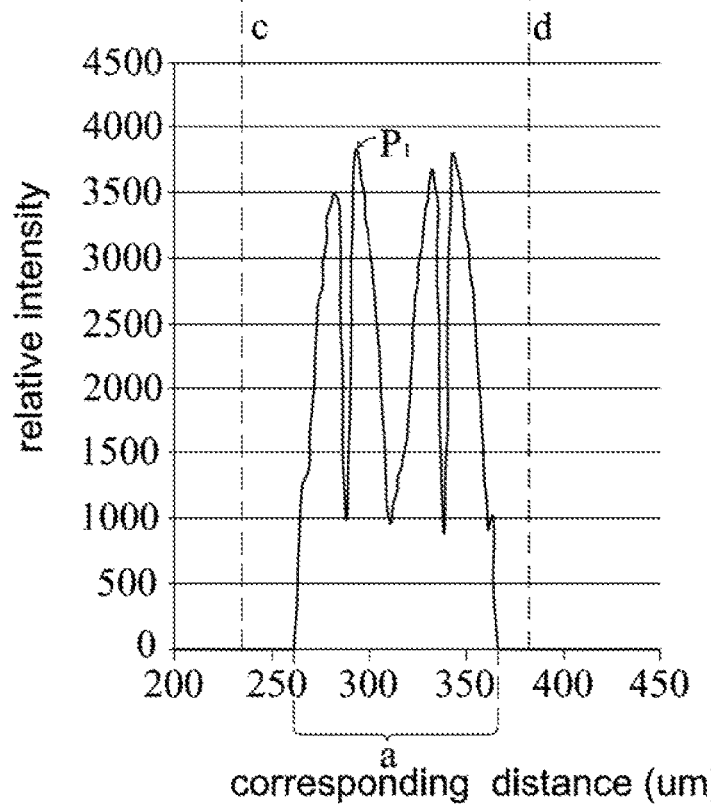
FIG. 7H is a diagram showing a relation between the relative intensity and the corresponding distance along an A-A' line shown in FIG. 7G.

FIG. 7G is a diagram showing a near-field image of the light-emitting device as shown in FIG. 1A and the surrounding environment of the light-emitting device, wherein the light-emitting device is operated at a current of 40±5 mA. Referring to FIG. 7G, the luminous intensity of the part shown by oblique lines is lower than the luminous intensity of the other part shown without oblique lines. FIG. 7H is a diagram showing a relation between the relative intensity and the corresponding distance along an A-A' line shown in FIG. 7G. Referring to FIG. 7G, the two light-emitting stacks 81 of the light-emitting device respectively emit the first light and the second light at the same time. That is, the two first electrodes 60 and the second electrode 70 shown in FIG. 1A and FIG. 1B are connected to a power supply at the same time. In the present embodiment, a first width $W_1$ of the first light extraction area 801a is about 95 μm and a first width $W_1$ of the second light extraction area 801b is about 95 μm. A distance between the first light extraction area 801a and the second light extraction area 801b is about 10 μm. As a result, a total width ($D_4$) of the first width $W_1$ of the first light extraction area 801a shown in FIG. 7A, the first width $W_1$ of the second light extraction area 801b shown in FIG. 7A and the distance between the first light extraction area 801a and the second light extraction area 801b is about 200 μm. Referring to FIG. 7H, the region marked as "a" represents the area of the first light extraction area 801a, the area of the second light extraction area 801b, and the area between the first light extraction area 801a and the second light extraction area 801b, wherein the corresponding distance of the region "a" is about 104 μm. Accordingly, a ratio of the corresponding distance of the region "a" in FIG. 7H to the total width $D_4$ of the light-emitting device shown in FIG. 7G is about 0.52 (104 μm/200 μm=0.52). Besides, the length $D_3$ of the first side wall 103 of the light-emitting device of the present embodiment is about 270 μm. Referring to the x-axis in FIG. 7H, the position corresponding to the third side wall 105 lies at about 239 μm as line c indicates, and the position corresponding to the fourth side wall 106 lies at about 380 μm as line "d" indicates. Referring to FIG. 7H, a ratio of the relative intensity of the light escaping from the third side wall 105 or the relative intensity of the light escaping from the fourth side wall 106 to the maximum relative intensity of the light escaping from the first light extraction area 801a and from the second light extraction area 801b is less than 0.1, and preferably, less than 0.08, and more preferably, less than 0.05. In the present embodiment, the relative intensity of the light escaping from the third side wall 105 is 0, and the relative intensity of the light escaping from the fourth side wall 106 is 0. The maximum relative intensity of the light escaping from the first light extraction area 801a is 3792 (P1), and the maximum relative intensity of the light escaping from the first light extraction area 801a and the second light extraction area 801b is 3792 (P3). The ratio of the relative intensity of the light escaping from the third side wall 105 or the relative intensity of the light escaping from the fourth side wall 106 to the maximum relative intensity of the light escaping from the first light extraction area 801a and the second light extraction area 801b is 0. Accordingly, when all of the light-emitting stacks 81 of the semiconductor stacks 80 emit light at the same time, the problem of light leakage from the sidewalls of the substrate 10 is alleviated or avoided.

Figure 8:
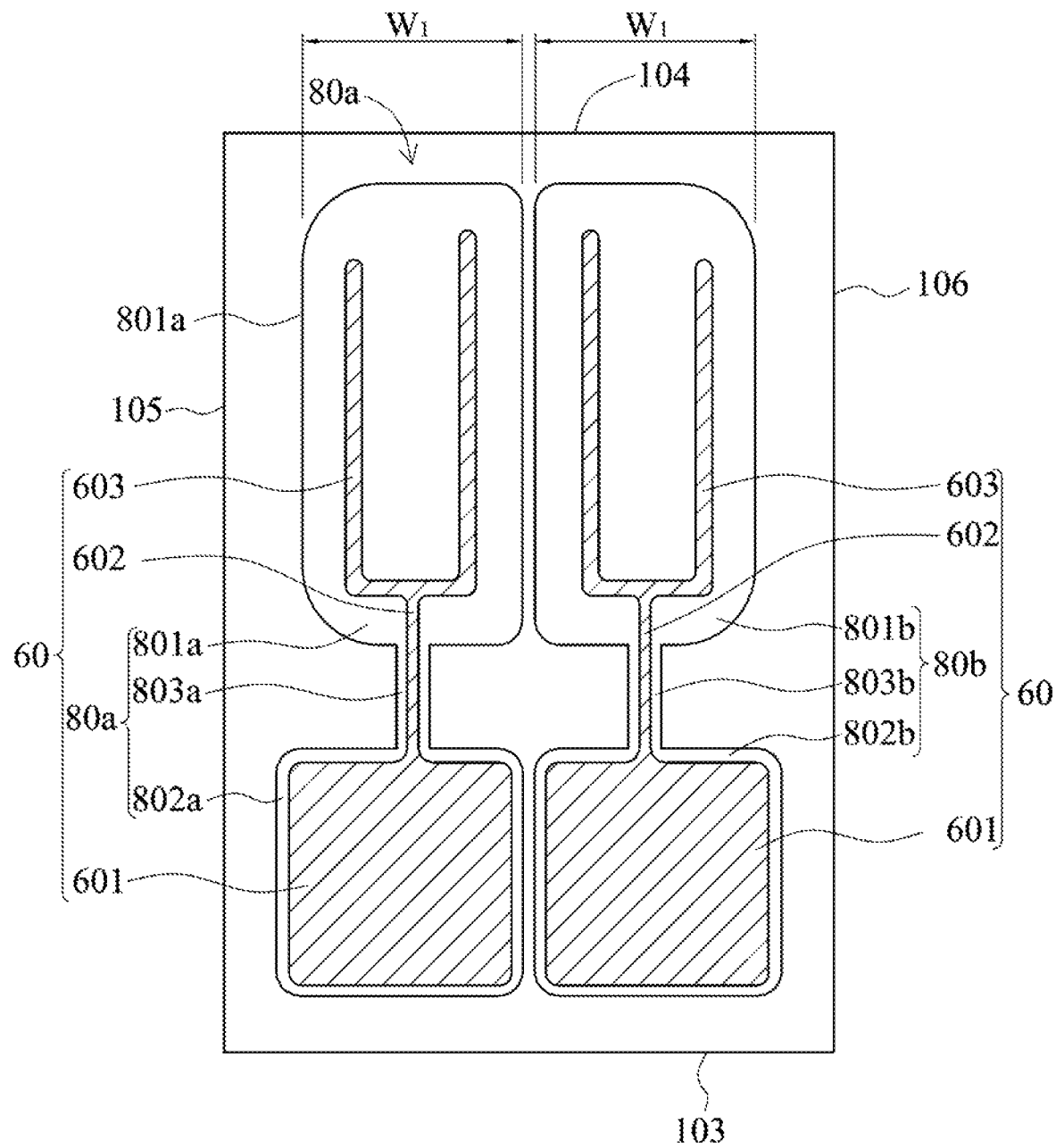
FIG. 8 is a top view of a light-emitting device according to a second embodiment of the present disclosure.

FIG. 8 is a top view of a light-emitting device according to a second embodiment of the present disclosure. The light-emitting device in accordance with the second embodiment of the present disclosure comprises substantially the same structure as the first embodiment, and the difference is that the shape of the first electrode 60 is different. In the present embodiment, the first extension 602 on the first semiconductor stack 80a extends from the electrode pad 601 on the first electrode pad area 802a along the first connecting area 803a to the first light extraction area 801a. The first extension 602 on the second semiconductor stack 80b extends from the electrode pad 601 on the second electrode pad area 802b along the second connecting area 803b to the second light extraction area 801b. The second extensions 603 on the first light extraction area 801a extend from the first extension 602 on the first connecting area 803a toward the third side wall 105 and the fourth side wall 106 respectively, and then extend toward the second side wall 104 of the substrate 10.

Figure 9A:
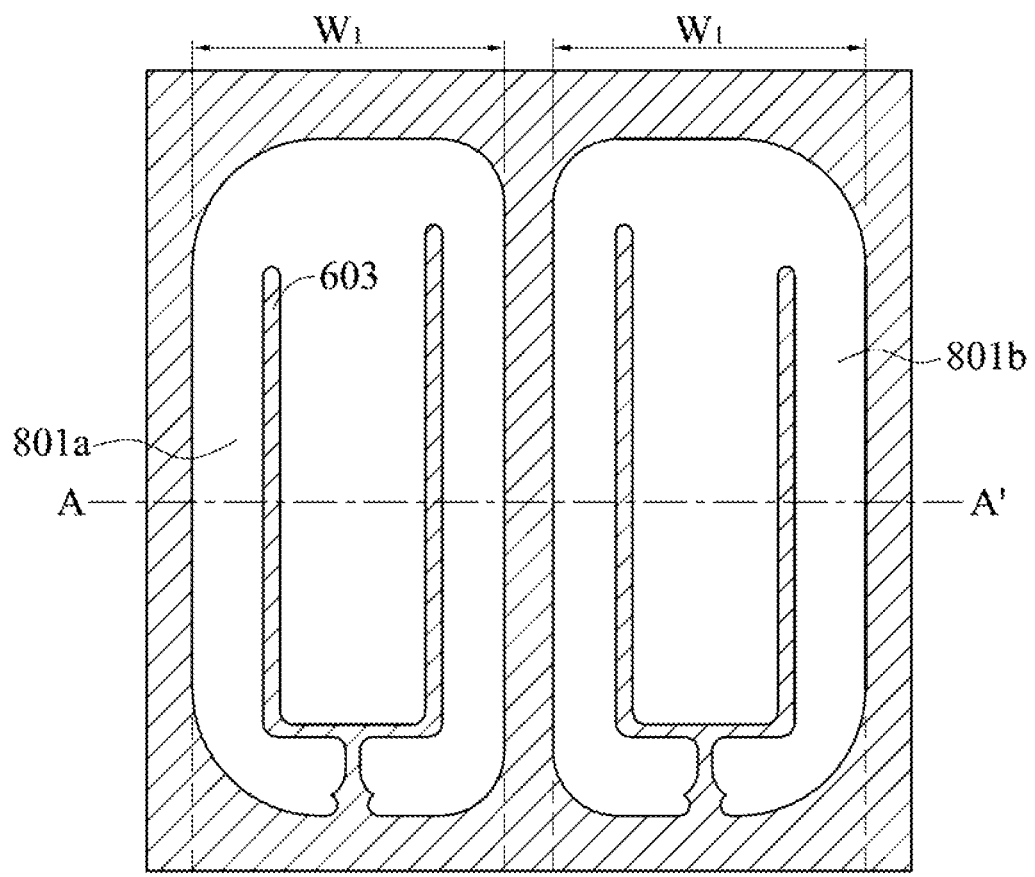
FIG. 9A is a diagram showing a near-field image of a part of the light-emitting device as shown in FIG. 8 when operated at a current of 40±5 mA.
Figure 9B:
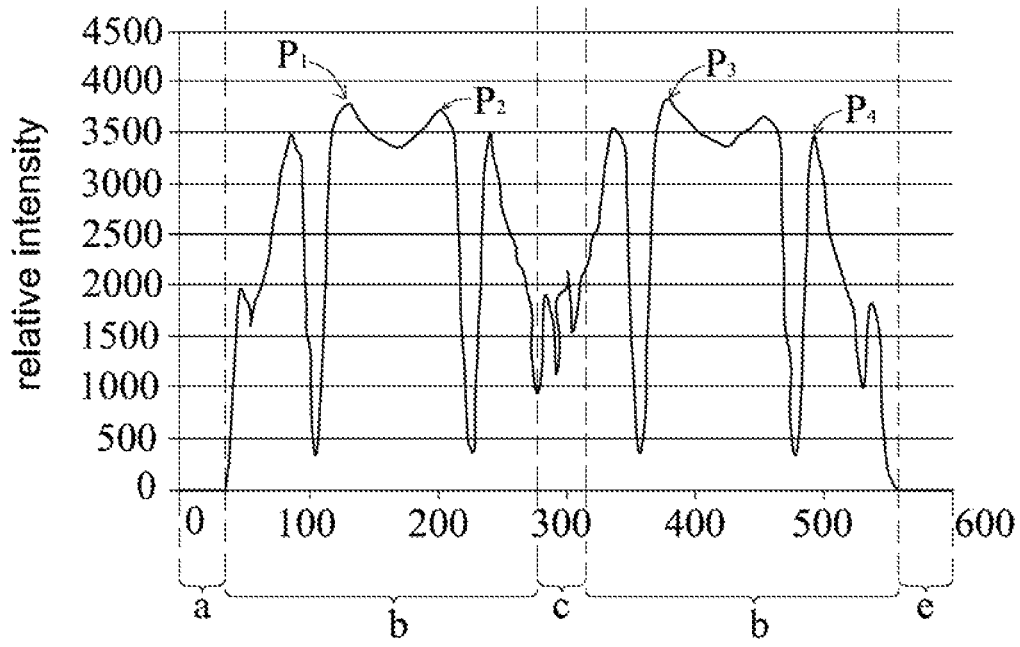
FIG. 9B is a diagram showing a relation between the relative intensity and the corresponding distance along an A-A' line shown in FIG. 9A.

FIG. 9A is a diagram showing a near-field image of a part of the light-emitting device as shown in FIG. 8 when operated at a current of 40±5 mA. FIG. 9B is a diagram showing a relation between the relative intensity and the corresponding distance along an A-A' line shown in FIG. 9A. Referring to FIG. 9A, the luminous intensity of the part shown by oblique lines is lower than the luminous intensity of the other part shown without oblique lines. Referring to FIG. 9A and FIG. 9B, the two light-emitting stacks 81 of the light-emitting device emit the first light and the second light respectively at the same time. That is, the two first electrodes 60 and the second electrode 70 are connected to a power supply at the same time. Region marked as "a" shown in FIG. 9B represents a part of the area between the third side wall 105 and the first light extraction area 801a shown in FIG. 8. Since the area between the third side wall 105 and the first light extraction area 801a is devoid of the active region 813, the relative intensity of the region "a" is 0. Region marked as "b" shown in FIG. 9B represents the area where the first light extraction area 801a lies as shown in FIG. 8. The region b has a first peak value $P_1$ with a maximum relative intensity and a second peak value $P_2$ with a minimum relative intensity. The second peak value $P_2$ with the minimum relative intensity is the peak value with a minimum relative intensity between $⅔ \times P_1$ and the first peak value $P_1$. For example, in the present embodiment, in the region b, the first peak value $P_1$ is 3776, the peak value with a minimum relative intensity between $⅔ \times 3776$ and 3776 is 3456, which is the second peak value $P_2$. In the region b as shown in FIG. 9B, the two troughs each with a relative intensity lower than 500 are positions where the two second extensions 603 on the first light extraction area 801a lie. Region marked as "c" represents the area between the first light extraction area 801a and the second light extraction area 801b as shown in FIG. 9A. Region marked as "d" shown in FIG. 9B represents the area where the second light extraction area 801b lies as shown in FIG. 9A. The region d has a first peak value $P_3$ with a maximum relative intensity and a second peak value $P_4$ with a minimum relative intensity. The second peak value $P_4$ with the minimum relative intensity is the peak value with a minimum relative intensity between $⅔ \times P_3$ and the first peak value $P_3$. For example, in the present embodiment, in the region d, the first peak value $P_3$ is 3840, the peak value with a minimum relative intensity between $⅔ \times 3840$ and 3840 is 3424, which is the second peak value $P_4$. In the region d, two troughs each with a relative intensity lower than 500 are positions where the two second extensions 603 on the second light extraction area 801b lie. Region marked as "e" shown in FIG. 9B represents a part of the area between the fourth side wall 106 and the second light extraction area 801b shown in FIG. 9A. Since the area between the fourth side wall 106 and the second light extraction area 801b is devoid of the active region 813, the relative intensity of the region "e" is 0. In the present disclosure, a ratio of the maximum relative intensity of the first light escaping from the first light extraction area 801a of the first semiconductor stack 80a to the maximum relative intensity of the second light escaping from the second light extraction area 801b of the second semiconductor stack 80b is not less than 0.8, and preferably, is not more than 1.2, and more preferably, is not less than 0.85, and more preferably, is not more than 1.15. In the present embodiment, the maximum relative intensity of the first light escaping from the first light extraction area 801a of the first semiconductor stack 80a is 3776, and the maximum relative intensity of the second light escaping from the second light extraction area 801b of the second semiconductor stack 80b is 3840. The ratio of the former one to the latter one is 0.98. Besides, in the present disclosure, a ratio of the maximum relative intensity of the first light escaping from the first light extraction area 801a of the first semiconductor stack 80a to the minimum relative intensity of the second light escaping from the second light extraction area 801b of the second semiconductor stack 80b is not less than 0.8, and preferably, is not more than 1.2, and more preferably, is not less than 0.85, and more preferably, is not more than 1.15. A ratio of the maximum relative intensity of the second light escaping from the second light extraction area 801b of the second semiconductor stack 80b to the minimum relative intensity of the first light escaping from the first light extraction area 801a of the first semiconductor stack 80a is not less than 0.8, and preferably, is not more than 1.2, and more preferably, is not less than 0.85, and more preferably, is not more than 1.15. In the present embodiment, the maximum relative intensity of the first light escaping from the first light extraction area 801a of the first semiconductor stack 80a is 3776, the minimum relative intensity of the second light escaping from the second light extraction area 801b of the second semiconductor stack 80b is 3424, and the ratio of the former one to the latter one is 1.1. In the present embodiment, the maximum relative intensity of the second light escaping from the second light extraction area 801b of the second semiconductor stack 80b is 3840, the minimum relative intensity of the first light escaping from the first light extraction area 801a of the first semiconductor stack 80a is 3456, and the ratio of the former one to the latter one is 1.11. In another embodiment, an average of the first peak value $P_1$ of the first light extraction area 801a, the second peak value $P_2$ of first light extraction area 801a, the first peak value $P_3$ of the second light extraction area 801b and the second peak value $P_4$ of the second light extraction area 801b is A. A ratio of the peak value with the maximum relative intensity among the four peak values to the average A is between 1 and 1.2, and preferably, between 1 and 1.1. For example, in the present embodiment, the average A is 3624, which is obtained by (3456+3840+3424+3776)/4. The peak value with the maximum relative intensity among the four peak values is 3840. 3840/3624 is 1.06. Accordingly, the light distribution of the light-emitting device comprising multiple semiconductor stacks is even when all of the semiconductor stacks emit light at the same time.

Figure 9C:
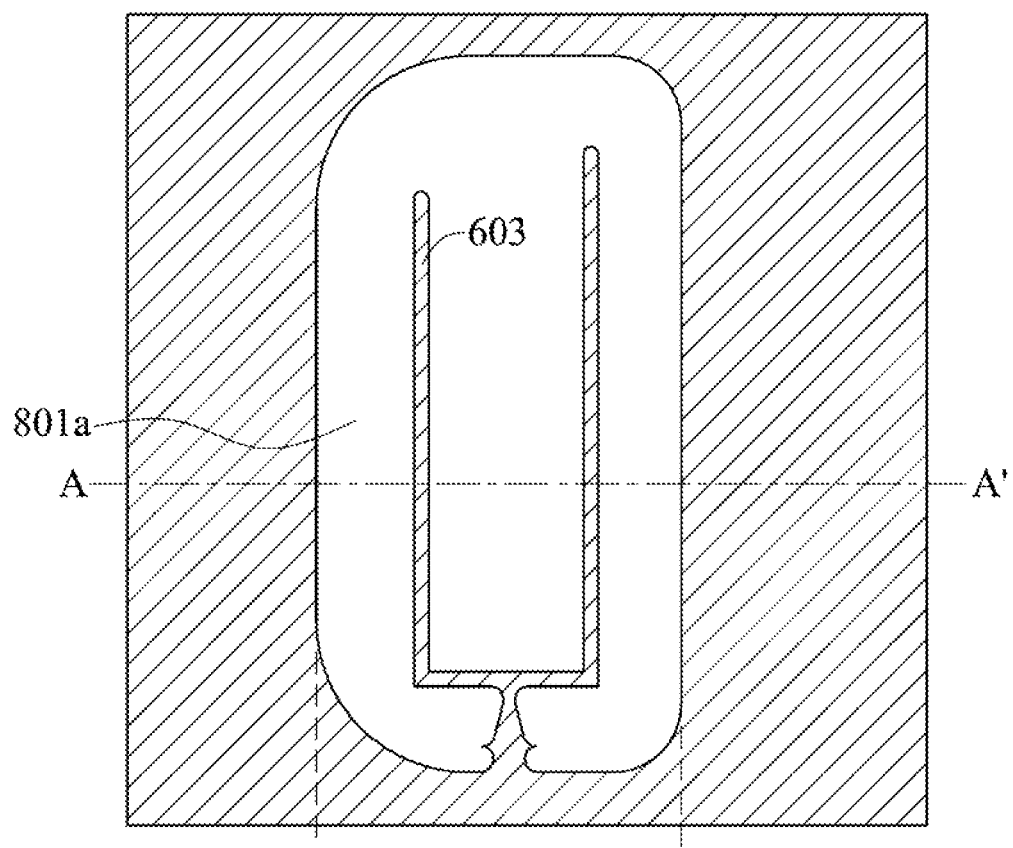
FIG. 9C is a diagram showing a near-field image of a part of the light-emitting device as shown in FIG. 8 when operated at a current of 40±5 mA.
Figure 9D:
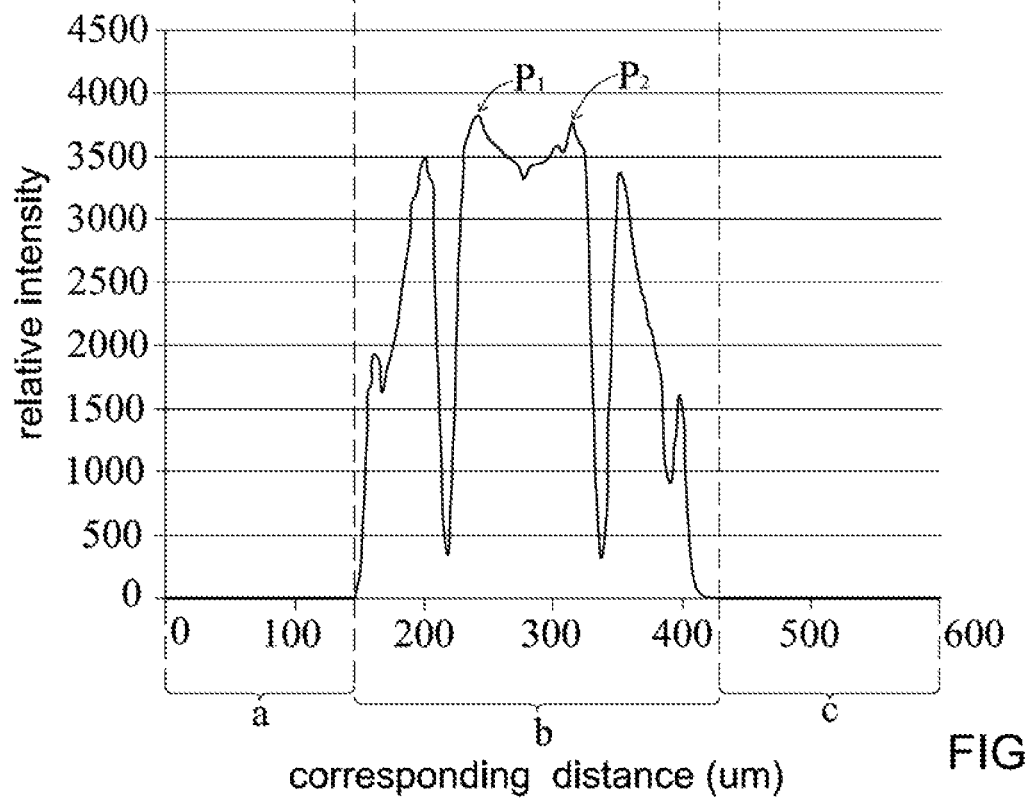
FIG. 9D is a diagram showing a relation between the relative intensity and the corresponding distance along an A-A' line shown in FIG. 9C.
Figure 9E:
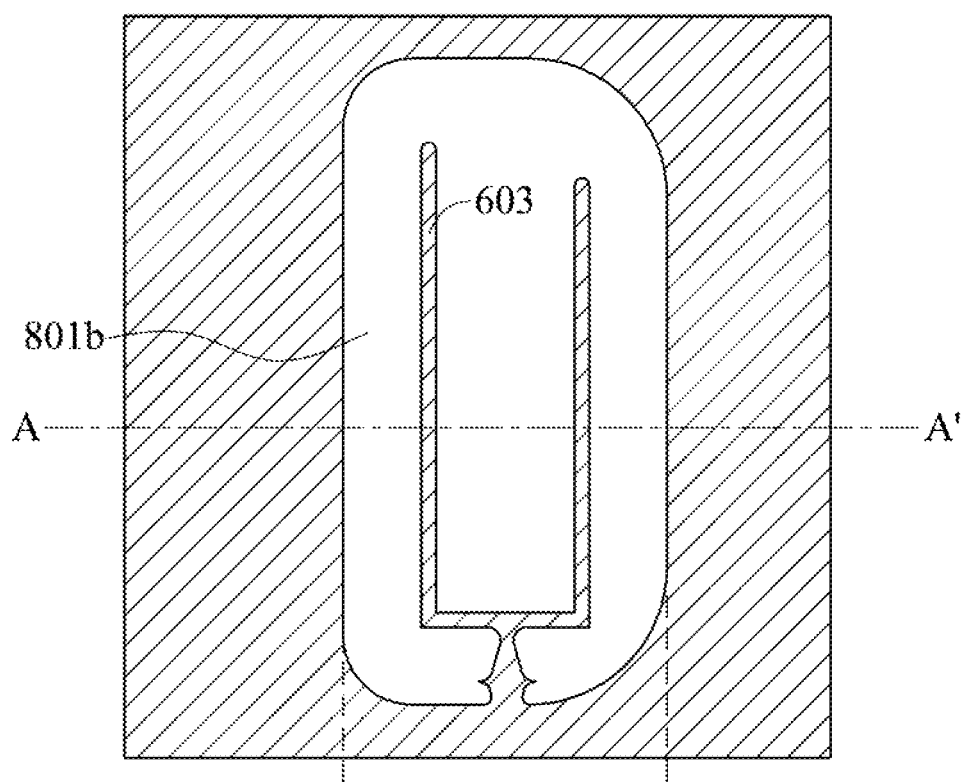
FIG. 9E is a diagram showing a near-field image of a part of the light-emitting device as shown in FIG. 8 when operated at a current of 40±5 mA.
Figure 9F:
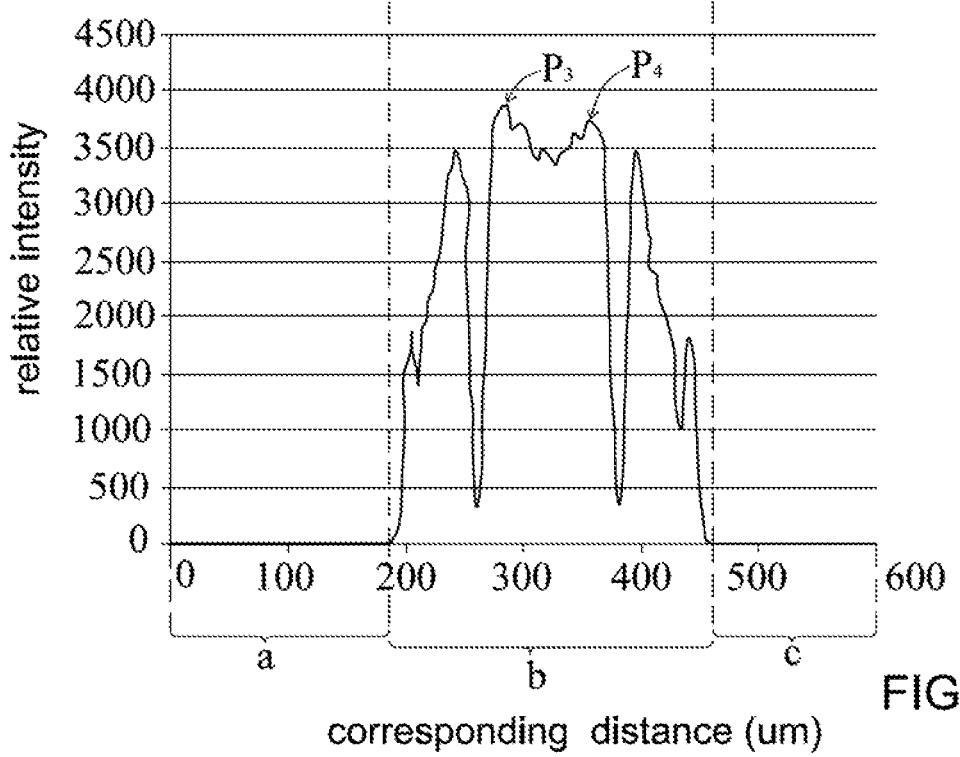
FIG. 9F is a diagram showing a relation between the relative intensity and the corresponding distance along an A-A' line shown in FIG. 9E.

FIG. 9C is a diagram showing a near-field image of a part of the light-emitting device as shown in FIG. 8 when operated at a current of 40±5 mA. The luminous intensity of the part shown by oblique lines is lower than the luminous intensity of the other part shown without oblique lines. FIG. 9D is a diagram showing a relation between the relative intensity and the corresponding distance along an A-A' line shown in FIG. 9C. Referring to FIG. 9C and FIG. 9D, the first electrode 60 on the first semiconductor stack 80a shown in FIG. 1A and FIG. 1B and the second electrode 70 shown in FIG. 1B are connected to a power supply at the same time while the first electrode 60 on the second semiconductor stack 80b is not connected to the power supply. That is, the light-emitting stack 81 of the first semiconductor stack 80a is independently controlled to emit the first light while the light-emitting stack 81 of the second semiconductor stack 80b does not emit the second light. Referring to FIG. 9D, region marked as "a" represents a part of the area between the third side wall 105 and the first light extraction area 801a shown in FIG. 9C. Since the area between the third side wall 105 and the first light extraction area 801a is devoid of the active region 813, the relative intensity of the area "a" is 0. Region marked as "b" shown in FIG. 9D represents the area where the first light extraction area 801a lies as shown in FIG. 9C. Region marked as "c" represents the area between the first light extraction area 801a and the second light extraction area 801b and a part of the second light extraction area 801b as shown in FIG. 9A. As shown in FIG. 9D, when the light-emitting stack 81 of the first semiconductor stack 80a is independently controlled to emit the first light, the first light barely escapes from the second light extraction area 801b of the second semiconductor stack 80b. Specifically, when the first semiconductor stack 80a is independently controlled to emit the first light, a ratio of the maximum relative intensity of the first light escaping from the second light extraction area 801b to the maximum relative intensity of the first light escaping from the first light extraction area 801a, which is the first peak value P1 shown in FIG. 9D, is less than 0.1, and preferably, less than 0.08, and more preferably, less than 0.05. In the present embodiment, the maximum relative intensity of the first light escaping from the second light extraction area 801b is 0, and the first light escaping from the first light extraction area 801a, which is the first peak value P1, is 3808. A ratio of the former maximum relative intensity to the latter one is 0. FIG. 9E is a diagram showing a near-field image of a part of the light-emitting device as shown in FIG. 8 when operated at a current of 40±5 mA. The luminous intensity of the part shown by oblique lines is lower than the luminous intensity of the other part shown without oblique lines. FIG. 9F is a diagram showing a relation between the relative intensity and the corresponding distance along an A-A' line shown in FIG. 9E. Referring to FIG. 9E and FIG. 9F, the first electrode 60 on the second semiconductor stack 80b shown in FIG. 1A and FIG. 1B and the second electrode 70 shown in FIG. 1B are connected to a power supply at the same time while the first electrode 60 on the first semiconductor stack 80a is not connected to the power supply. That is, the light-emitting stack 81 of the second semiconductor stack 80b is independently controlled to emit the second light while the light-emitting stack 81 of the first semiconductor stack 80a does not emit the first light. Referring to FIG. 9F, region marked as "a" represents the area of a part of the first light extraction area 801a and the area between first light extraction area 801a and the second light extraction area 801b as shown in FIG. 8. Region marked as "b" represents the area where the second light extraction area 801b lies as shown in FIG. 9E.

Region marked as "c" represents a part of the area between the fourth side wall 106 and the second light extraction area 801b as shown in FIG. 8. Since the area between the fourth side wall 106 and the second light extraction area 801b is devoid of the active region 813, the relative intensity of the region "c" is 0. As shown in FIG. 9F, when the light-emitting stack 81 of the second semiconductor stack 80b is independently controlled to emit the second light, the second light barely escapes from the first light extraction area 801a of the first semiconductor stack 80a. Specifically, when the second semiconductor stack 80b is independently controlled to emit the second light, a ratio of the maximum relative intensity of the second light escaping from the first light extraction area 801a to the maximum relative intensity of the second light, which is the first peak value $P_3$ as shown in FIG. 9F, escaping from the second light extraction area 801b is less than 0.1, and preferably, less than 0.08, and more preferably, less than 0.05. In the present embodiment, the maximum relative intensity of the second light escaping from the first light extraction area 801a is 0, and the second light escaping from the second light extraction area 801b, which is the first peak value P3, is 3856. A ratio of the former maximum relative intensity to the latter one is 0. Accordingly, when each of the light-emitting stacks 810f the light-emitting device of the present embodiment is independently controlled to emit light, a problem of the light escaping from the neighboring light extraction area or a problem of crosstalk can be alleviated or avoided.

Figure 9G:
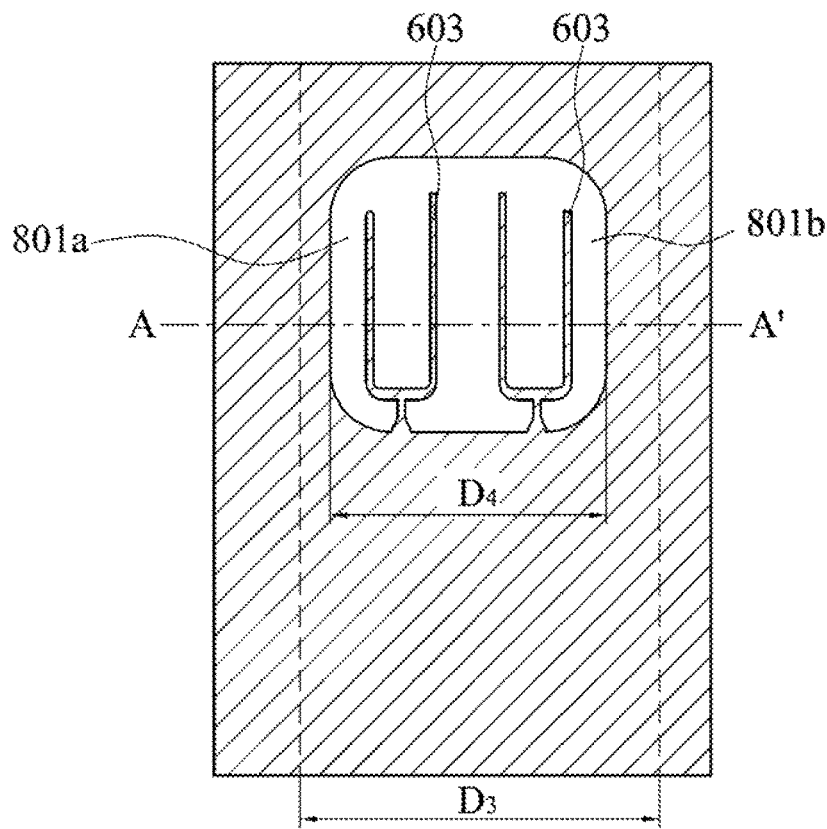
FIG. 9G is a diagram showing a near-field image of the light-emitting device as shown in FIG. 8 and the surrounding environment of the light-emitting device, wherein the light-emitting device is operated at a current of 40±5 mA.
Figure 9H:
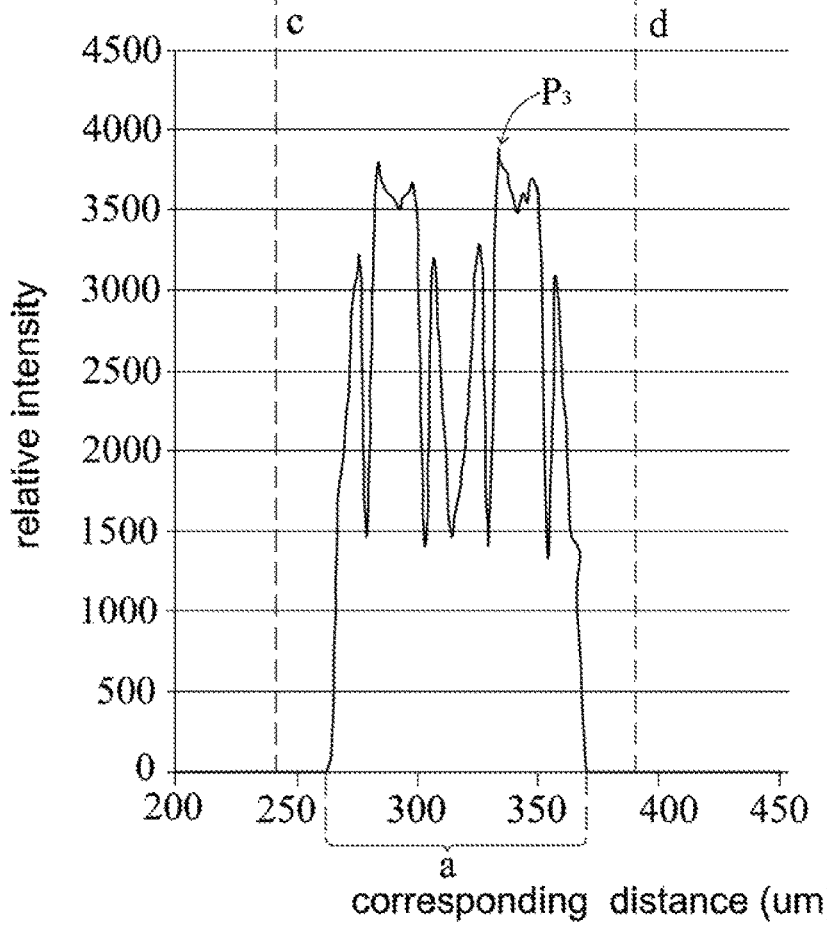
FIG. 9H is a diagram showing a relation between the relative intensity and the corresponding distance along an A-A' line shown in FIG. 9G.

FIG. 9G is a diagram showing a near-field image of the light-emitting device as shown in FIG. 8 and the surrounding environment of the light-emitting device, wherein the light-emitting device is operated at a current of 40±5 mA. The luminous intensity of the part shown by oblique lines is lower than the luminous intensity of the other part shown without oblique lines. FIG. 9H is a diagram showing a relation between the relative intensity and the corresponding distance along an A-A' line shown in FIG. 9G. Referring to FIG. 9G, the two light-emitting stacks 81 of the light-emitting device respectively emit the first light and the second light at the same time. That is, the two first electrodes 60 and the second electrode 70 shown in FIG. 1A and FIG. 1B are connected to a power supply at the same time. In the present embodiment, a first width $W_1$ of the first light extraction area 801a is about 95 μm and a first width $W_1$ of the second light extraction area 801b is about 95 μm. A distance between the first light extraction area 801a and the second light extraction area 801b is about 10 μm. As a result, a total width ($D_4$) of the first width $W_1$ of the first light extraction area 801a, the first width $W_1$ of the second light extraction area 801b and the distance between the first light extraction area 801a and the second light extraction area 801b is about 200 μm. Referring to FIG. 9H, the region marked as "a" represents the area from the first light extraction area 801a, the area of the second light extraction area 801b, and the area between the first light extraction area 801a and the second light extraction area 801b, wherein the corresponding distance of the region "a" is about 107 μm. Accordingly, a ratio of the corresponding distance of the region "a" in FIG. 9H to the total width $D_4$ of the light-emitting device shown in FIG. 9G is about 0.54 (107 μm/200 μm=0.54). Besides, the length $D_3$ of the first side wall 103 of the light-emitting device of the present embodiment is about 270 μm. Referring to the x-axis in FIG. 9H, the position corresponding to the third side wall 105 lies at about 244 μm, as line c indicates, and the position corresponding to the fourth side wall 106 lies is at about 389 μm, as line "d" indicates. Referring to FIG. 9H, a ratio of the relative intensity of the light escaping from the third side wall 105 or the relative intensity of the light escaping from the fourth side wall 106 to the maximum relative intensity of the light escaping from the first light extraction area 801a or from the second light extraction area 801b is less than 0.1, and preferably, less than 0.08, and more preferably, less than 0.05. In the present embodiment, the relative intensity of the light escaping from the third side wall 105 is 0, and the relative intensity of the light escaping from the fourth side wall 106 is 0. The maximum relative intensity of the light escaping from the first light extraction area 801a and the second light extraction area 801b is 3840 (P3). The ratio of the relative intensity of the light escaping from the third side wall 105 or the relative intensity of the light escaping from the fourth side wall 106 to the maximum relative intensity of the light escaping from the first light extraction area 801a and the second light extraction area 801b is 0. Accordingly, when all of the light-emitting stacks 81 of the semiconductor stacks 80 emit light at the same time, the problem of light leakage from the sidewalls of the substrate 10 is alleviated or avoided.

Figure 10:
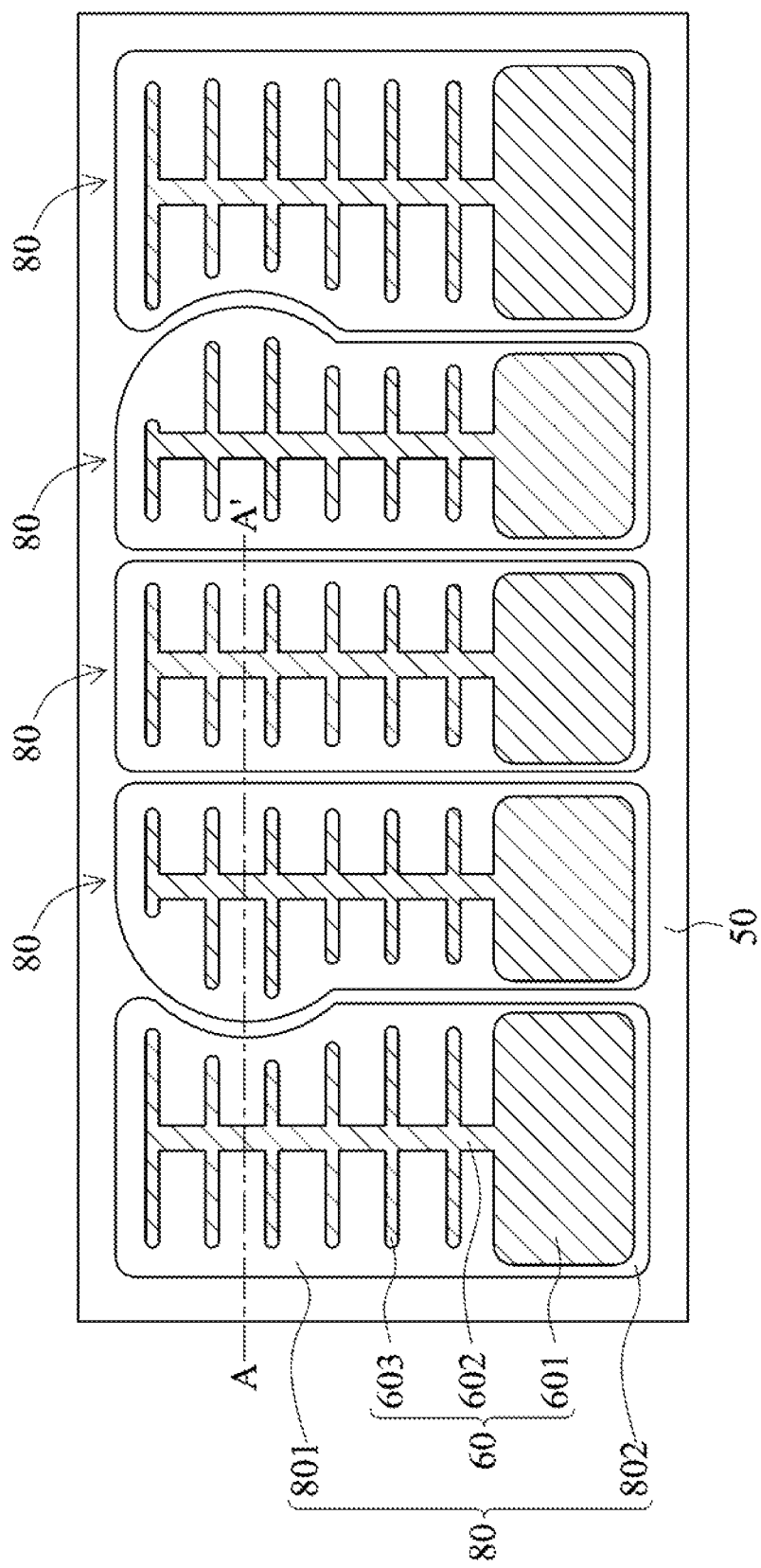
FIG. 10 is a top view of a light-emitting device according to a third embodiment of the present disclosure.

FIG. 10 is a top view of a light-emitting device according to a third embodiment of the present disclosure. The light-emitting device in accordance with the third embodiment of the present disclosure comprises substantially the same structure as the first embodiment, and the difference is that the light-emitting device comprises five semiconductor stacks 80 separated from each other and with different shapes. Each of the semiconductor stacks 80 of the present embodiment is devoid of the connecting areas 803a, 803b as shown in FIG. 1A. That is, the electrode pad area 802 directly contacts the light extraction area 801 without a connecting area disposed therebetween. Besides, from a top view of the light-emitting device, the shape of the second semiconductor contact layer 83 is substantially the same as that of the first extension 602 and the multiple second extensions 603.

Figure 11:
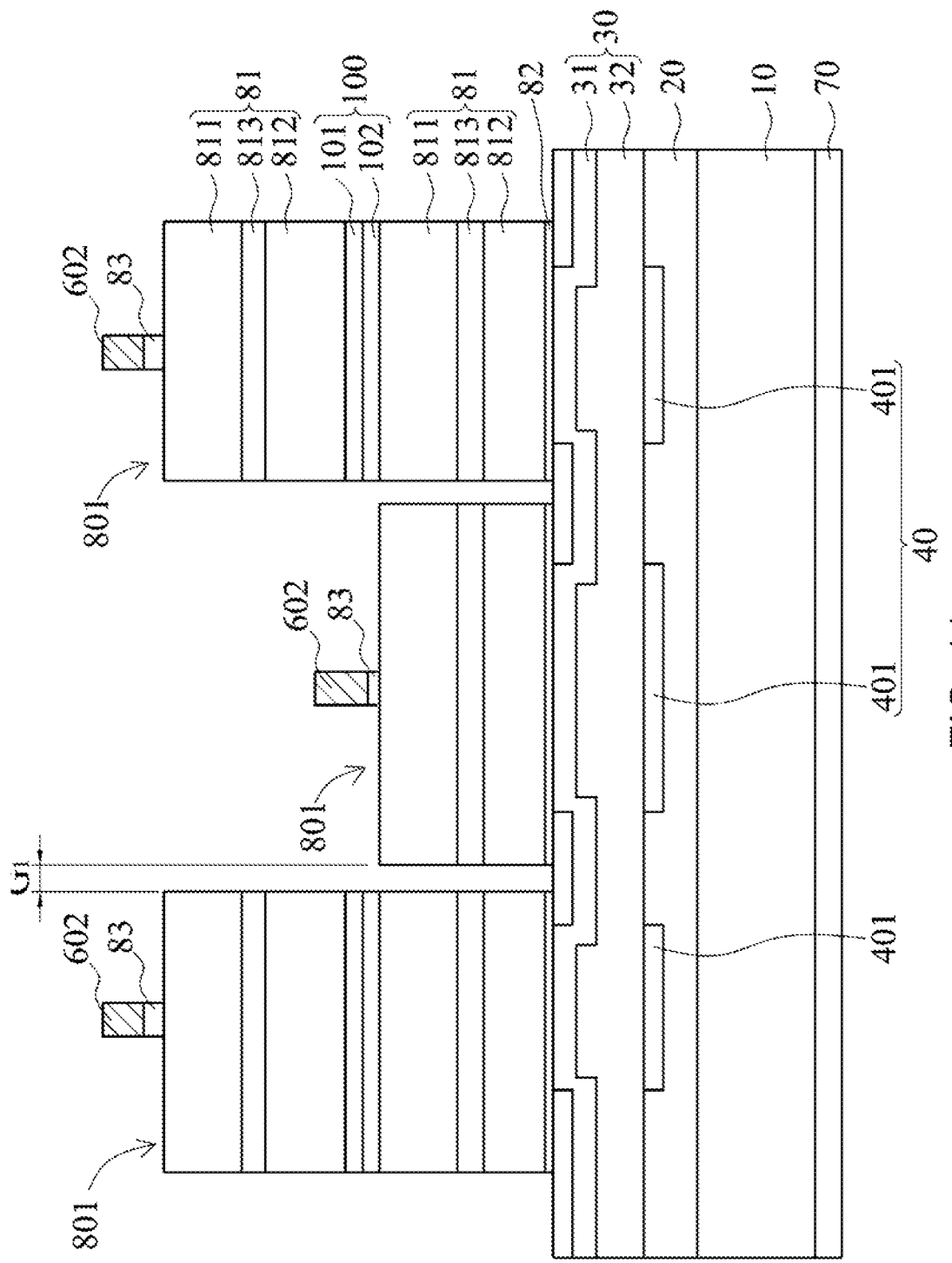
FIG. 11 is a cross-sectional diagram of the light-emitting device according to a fourth embodiment of the present disclosure.

FIG. 11 is a cross-sectional diagram of the light-emitting device according to a fourth embodiment of the present disclosure. The top view of the light-emitting device according to the fourth embodiment is substantially the same as shown in FIG. 10. FIG. 11 is a cross-sectional diagram along an A-A' shown in FIG. 10. The light-emitting device in accordance with the fourth embodiment of the present disclosure comprises substantially the same structure as the third embodiment, and the difference is described below. From a cross-sectional view of the light-emitting device, one of the semiconductor stacks 80 comprises multiple light-emitting stacks 81 and tunneling structures 100. Each of the tunneling structures 100 is between two neighboring light-emitting stacks 81. The tunneling structure 100 comprises a first tunneling layer 101 and a second tunneling layer 102. The first tunneling layer 101 and the second tunneling layer 102 are stacked between the two light-emitting stacks 81. The conductivity type of the first tunneling layer 101 is different from that of the second tunneling layer 102. In the present embodiment, the first tunneling layer 101 comprises p-type semiconductor. The second tunneling layer 102 comprises n-type semiconductor. The n-type dopant comprises Si or Te. The p-type dopant comprises C, Mg, or Zn. In one embodiment, the n-type dopant comprises Te and the p-type dopant comprises C. The first tunneling layer 101 comprises a doping concentration such as higher than $1 \times 10^{18}$ cm$^{-3}$, and preferably, not less than $5 \times 10^{18}$ cm$^{-3}$, and more preferably, between $5 \times 10^{18}$ cm$^{-3}$ and $1 \times 10^{22}$ cm$^{-3}$. The tunneling structures 100 converts the incoming electrons into holes or converts the incoming holes into electrons. The two light-emitting stacks 81 are in serial connection through the tunneling structures 100. That is, the two light-emitting stacks 81 form a pn-pn or np-np structure. The first tunneling layer 101 and the second tunneling layer 102 comprise III-V semiconductor material, such as InGaP or AlGaAs. Preferably, the band gap of the first tunneling layer 101 and the band gap of the second tunneling layer 102 are both greater than the band gap of the well layers of the active region 813. The thickness of the first tunneling layer 101 is not less than 5 nm, and preferably, not more than 100 nm. In one embodiment, the thickness of the second tunneling layer 102 is greater than that of the first tunneling layer 101. Preferably, the thickness of the second tunneling layer 102 is not less than 10 nm, and preferably, not greater than 100 nm. A difference between the thickness of the first tunneling layer 101 and the thickness of the second tunneling layer 102 is greater than 20 nm, preferably, between 30 and 50 nm. In the present embodiment, two of the semiconductor stacks 80 both comprise two vertically-stacked light-emitting stacks 81 and a tunneling structure 100 between the two light-emitting stacks 81. In the present embodiment, the structures of the two light-emitting stacks 81 of each of the semiconductor stacks 80 are substantially the same as the structure shown in FIG. 1B. That is, each of the light-emitting stacks 81 of each of the semiconductor stacks 80 comprises a first semiconductor layer 811, a second semiconductor layer 812 on the first semiconductor layer 811, an active region 813 between the first semiconductor layer 811 and the second semiconductor layer 812. Besides, the first semiconductor contact layer 82 is between the light-emitting stack 81 closer to the substrate 10 and the contact layer 30. The second semiconductor contact layer 83 is between the light-emitting stack 81 farther from the substrate 10 and the first electrode 60. In one embodiment, each of the active regions 813 of the two vertically-stacked light-emitting stacks 81 emits light with a peak wavelength λ. The light emitted from the two active regions 813 escapes from the same light extraction area of the semiconductor stack 80. In one embodiment, in one of the semiconductor stacks 80, the light emitted from the two active regions 813 and escaping from the same light extraction area are both visible red light and the peak wavelengths λ of the light from the two active regions 813 are substantially the same. Therefore, the light-emitting efficiency of the light-emitting device of the present embodiment is improved. In one embodiment, the light emitted from the two active regions 813 in one of the semiconductor stacks 80 are both visible light. The two peak wavelengths λ are between 580 nm and 700 nm, and preferably, between 600 nm and 670 nm. Preferably, a difference between the two peak wavelengths λ is less than 10 nm. In another embodiment, the lights emitted from the two active regions 813 in one of the semiconductor stacks 80 are both invisible light. The two peak wavelengths λ are between 750 nm and 1500 nm, and preferably, between 800 nm and 1000 nm. In the present embodiment, the light emitted from the two active regions 813 in one of the semiconductor stacks 80 are with different peak wavelengths. For example, the active regions 813 closer to the substrate 10 emits invisible light with a peak wavelength λ between 750 nm and 1500 nm, and preferably, between 800 nm and 1000 nm. The active regions 813 farther from the substrate 10 emits visible light with a peak wavelength λ between 580 nm and 700 nm, and preferably, between 600 nm and 670 nm. The two lights with different peak wavelengths λ escape from the same light extraction area of the semiconductor stack 80 at the same time.

In one embodiment, one of the semiconductor stacks 80 comprises multiple light-emitting stacks 81 stacked vertically and is devoid of a tunneling structure 100 disposed between the two neighboring light-emitting stacks 81 as described in the fourth embodiment. That is, in the present embodiment, two neighboring light-emitting stacks 81 form a pn-np or np-pn structure. Besides, when the light-emitting stacks 81 farther from the substrate 10 is independently controlled to emit light, the light-emitting stacks 81 closer to the substrate 10 can be controlled by any means so as not to emit light. For example, a metal layer can be formed on the outer sidewall of the light-emitting stacks 81 closer to the substrate 10 so as to short-circuit the light-emitting stacks 81. Accordingly, only the light-emitting stacks 81 farther from the substrate 10 emit light and the light escapes from the light extraction area of the semiconductor stack 80.

In one embodiment, the multiple first electrodes 60 and the second electrode 70 are on the same side of the substrate 10. The light-emitting device can be flipped and bonded to a carrier comprising a circuit through the first electrodes 60 and the second electrode 70.

In the present embodiment, the growth substrate 90 provides a top surface for epitaxially forming the layers thereon. The growth substrate 90 has a thickness thick enough for supporting the layers or the structures grown thereon. Preferably, the growth substrate 90 has a thickness not less than 100 μm, and preferably, not greater than 250 μm. The growth substrate 90 is single crystalline and comprises a semiconductor material, for example, a Group III-V semiconductor material or a Group IV semiconductor material. In one embodiment, the growth substrate 90 comprises a Group III-V semiconductor material of a conductivity type. In the present embodiment, the Group III-V semiconductor material comprises GaAs of n-type conductivity. The n-type dopant comprises Si.

When the first electrodes 60 and the second electrode 70 are on the opposite sides of the substrate 10, the substrate 10 comprises conductive material for conducting a current between the first electrodes 60 and the second electrode 7. The substrate 10 has a thickness thick enough for supporting the layers or structures thereon, for example, greater than 100 μm. The substrate 10 comprises a conductive material comprising Si, Ge, Cu, Mo, MoW, AlN, ZnO, or CuW. Preferably, the permanent substrate 80 comprises Si or CuW.

The first electrode 60 and the second electrode 70 are for connecting to a power supply and conducting a current therebetween. The material of the first electrode 60 and the second electrode 70 comprise transparent conductive material or metal material, wherein the transparent conductive material comprises transparent conductive oxide, and wherein the metal material comprises Au, Pt, GeAuNi, Ti, BeAu, GeAu, Al, ZnAu or Ni.

The connecting layer 2 comprises transparent conducive oxide, metal material, insulating oxide, or polymer. The transparent conducive oxide comprises indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), or indium zinc oxide (IZO). The metal material comprises In, Sn, Au, Ti, Ni, Pt, W or the alloys thereof. The insulating oxide comprises aluminum oxide ($AlO_x$), silicon oxide ($SiO_x$), or silicon oxynitride ($SiO_xN_y$). The polymer comprises epoxy, polyimide, perfluorocyclobutane, benzocyclobutene (BCB) or silicone. The connecting layer 20 has a thickness between 400 nm and 5000 nm.

The contact layer 30 comprises a first transparent conducive oxide layer 31 and a second transparent conducive oxide layer 32. The first transparent conducive oxide layer 31 covers the blocking layer 50 and is in direct contact with the first semiconductor contact layer 82 to reduce the series resistance between the second electrode 70 and the light-emitting stacks 81. The second transparent conducive oxide layer 32 is between the connecting layer 20 and the first transparent conducive oxide layer 31. The material of the first transparent conducive oxide layer 31 is different from the material of the second transparent conducive oxide layer 32. In one embodiment, the method of forming the second transparent conducive oxide layer 32 is different from that of the first transparent conducive oxide layer 31. The second transparent conducive oxide layer 32 can improve lateral current spreading, that is, improve current spreading at a direction vertical to the stacking direction. Or, the second transparent conducive oxide layer 32 can serve as a window layer. The second transparent conducive oxide layer 32 has a refractive index lower than the refractive index of the light-emitting stack 81 to improve transmittance. The thickness of the second transparent conducive oxide layer 32 is greater than that of the first transparent conducive oxide layer 31. For example, from the cross-sectional view of the light-emitting device, the thickness of the first transparent conducive oxide layer 31 is between 25 Å and 200 Å, and preferably, between 40 Å and 60 Å. The thickness of the second transparent conducive oxide layer 32 is between 25 Å and 2000 Å, and preferably, between 600 Å and 1700 Å for improving lateral current spreading. In one embodiment, the light-emitting device is devoid of the second transparent conducive oxide layer 32. The thickness of the transparent conducive oxide layer 31 is thick enough to replace the second transparent conducive oxide layer 32. The material of the second transparent conducive oxide layer 32 and the first transparent conducive oxide layer 31 comprise indium tin oxide (ITO), aluminum zinc oxide (AZO), SnCdO, antimony tin oxide (ATO), ZnO, $Zn_2SnO_4$ (ZTO) or indium zinc oxide (IZO). In the present embodiment, the transparent conducive oxide layer 31 comprises ITO, and the second transparent conducive oxide layer 32 comprises IZO. The first transparent conducive oxide layer 31 is formed by e-gun, and the second transparent conducive oxide layer 32 is formed by sputtering. The transparent conducive oxide layer formed by sputtering has a higher density than the transparent conducive oxide layer formed by e-gun. That is, in the present embodiment, the density of the first transparent conducive oxide layer 31 is higher than that of the second transparent conducive oxide layer 32 to improve the lateral current spreading The reflector 40 has a reflectivity higher than 85% to the light emitted from the light-emitting stacks 81. Preferably, the reflector 40 has a thickness between 2500 Å and 7500 Å. The reflector 40 comprises metal, such as Au and Ag.

In one embodiment, the light-emitting device further comprises a passivation layer covering the sidewall of the semiconductor stacks 80 and a part of the upper surface of each of the semiconductor stacks 80. The passivation layer serves as a protection layer to protect the semiconductor stacks 80 from environment damage, such as moisture, or mechanical damage.

The method of performing epitaxial growth comprises metal-organic chemical vapor deposition (MOCVD), hydride vapor phase epitaxy (HVPE), molecular beam epitaxy (MBE), or liquid-phase epitaxy (LPE).

In accordance with a further embodiment of the present disclosure, the structures in the embodiments of the present disclosure can be combined or changed. For example, one of the semiconductor stacks of the light-emitting device as shown in FIG. 11 comprises the third semiconductor layer 814 as shown in FIG. 1B. The third semiconductor layer 814 is between the light-emitting stack 81 farther from the substrate 10 and the second semiconductor contact layer 83. In another example, the first semiconductor stack 80 as shown in FIG. 1B comprises multiple vertically stacked light-emitting stacks 81 as shown in FIG. 11.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a substrate comprising a first side;
   a first semiconductor stack on the first side and comprising a first light extraction area with a first width;
   a second semiconductor stack on the first side and separated from the first semiconductor stack;
   a blocking layer between the first semiconductor stack, the second semiconductor stack and the substrate; and
   a reflector between the first semiconductor stack and the substrate, and having a second width less than the first width in a cross-sectional view of the light-emitting device;
   wherein the first semiconductor stack and the second semiconductor stack are independently controlled to emit light.

2. The light-emitting device according to claim 1, wherein the first semiconductor stack is capable of emitting a first light having a first peak wavelength and the second semiconductor stack is capable of emitting a second light having a second peak wavelength different from the first peak wavelength.

3. The light-emitting device according to claim 1, wherein one of the first semiconductor stack and the second semiconductor stack comprises two active regions, and the light emitted from the two active regions are with different peak wavelengths.

4. The light-emitting device according to claim 1, wherein a distance between the first semiconductor stack and the second semiconductor stack is not greater than 20 μm.

5. A light-emitting device comprising:
   a substrate comprising a first side;
   a first semiconductor stack on the first side of the substrate and having a light extraction area having a first width;
   a second semiconductor stack on the first side of the substrate and separated from the first semiconductor stack; and
   a reflector between the first semiconductor stack and the substrate and having a second width less than the first width in a cross-sectional view of the light-emitting device,
   when the first semiconductor stack emits a first light and the second semiconductor stack does not emit a light, a ratio of the intensity of the first light emitted from the second semiconductor stack to the intensity of the first light emitted from the first semiconductor stack is less than 0.1 from a near field image of the light-emitting device.

6. The light-emitting device according to claim 5, wherein a distance between the first semiconductor stack and the second semiconductor stack is not greater than 20 µm.

7. The light-emitting device according to claim 5, further comprising a blocking layer between the first semiconductor stack, the second semiconductor stack and the substrate.

8. The light-emitting device according to claim 5, wherein the reflector is further between the second semiconductor stack and the substrate.

9. The light-emitting device according to claim 5, further comprising a connecting layer between the substrate and the first semiconductor stack.

10. The light-emitting device according to claim 5, further comprising a first electrode pad on the first semiconductor stack, wherein the first electrode pad does not vertically overlap the reflector.

11. The light-emitting device according to claim 1, further comprising a connecting layer between the substrate and the first semiconductor stack.

12. The light-emitting device according to claim 1, wherein the second semiconductor stack comprises a second light extraction area having a third width different from the first width.

13. The light-emitting device according to claim 1, wherein the first semiconductor stack has an inclined sidewall.

14. The light-emitting device according to claim 1, wherein the blocking layer has a first portion that does not vertically overlap the reflector.

15. The light-emitting device according to claim 14, further comprising a contact layer between the reflector and the first semiconductor stack.

16. The light-emitting device according to claim 1 further comprising a second electrode pad on the second semiconductor stack and an extension extending from the second electrode pad, wherein the extension vertically overlaps the reflector.

17. The light-emitting device of claim 7, wherein the blocking layer has a first portion that does not vertically overlap the reflector.

18. The light-emitting device according to claim 14, wherein the blocking layer further has a second portion overlapping the first semiconductor stack and a third portion overlapping the second semiconductor stack.

19. The light-emitting device according to claim 17, wherein the first portion is not covered by the first semiconductor stack and the second semiconductor stack.

20. The light-emitting device according to claim 17, wherein the reflector is between the blocking layer and the substrate.

* * * * *